(12) United States Patent  (10) Patent No.: US 8,148,194 B2
Fujii et al.  (45) Date of Patent: Apr. 3, 2012

(54) SOLAR CELL, MANUFACTURING METHOD THEREOF AND ELECTRODE MATERIAL

(75) Inventors: Shuichi Fujii, Yokaichi (JP); Yasuhiro Matsubara, Yokaichi (JP); Yuko Fukawa, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 290 days.

(21) Appl. No.: 12/037,009

(22) Filed: Feb. 25, 2008

(65) Prior Publication Data

US 2008/0220559 A1 Sep. 11, 2008

Related U.S. Application Data

(62) Division of application No. 10/278,757, filed on Oct. 22, 2002, now abandoned.

(30) Foreign Application Priority Data

Oct. 24, 2001 (JP) .................................. 2001-326832
Nov. 19, 2001 (JP) .................................. 2001-352818
Mar. 12, 2002 (JP) .................................. 2002-67444

(51) Int. Cl.
*H01L 21/00* (2006.01)

(52) U.S. Cl. .................................. 438/98; 257/E31.124

(58) Field of Classification Search ...................... 438/98
See application file for complete search history.

(56) References Cited

U.S. PATENT DOCUMENTS

| 3,357,872 | A | * | 12/1967 | Belasco | .................. | 438/309 |
| 3,611,062 | A | * | 10/1971 | Rideout | .................. | 257/599 |
| 3,697,337 | A | * | 10/1972 | Stehlin | .................. | 438/326 |
| 3,841,927 | A | * | 10/1974 | Florence et al. | .................. | 438/567 |
| 3,929,512 | A | * | 12/1975 | Nicholas et al. | .................. | 438/383 |
| 4,075,754 | A | * | 2/1978 | Cook, Jr. | .................. | 438/217 |
| 4,229,233 | A |  | 10/1980 | Hansen et al. |  |  |
| 5,320,684 | A |  | 6/1994 | Amick et al. |  |  |
| 5,500,055 | A |  | 3/1996 | Toyama et al. |  |  |
| 5,609,694 | A |  | 3/1997 | Asai |  |  |
| 5,698,451 | A |  | 12/1997 | Hanoka |  |  |
| 5,849,108 | A |  | 12/1998 | Kariya et al. |  |  |

(Continued)

FOREIGN PATENT DOCUMENTS

JP 60027195 A 6/1985

(Continued)

OTHER PUBLICATIONS

German language office action and its English language translation for corresponding German application 10250815.1-33 lists the references above.

(Continued)

*Primary Examiner* — David Zarneke
(74) *Attorney, Agent, or Firm* — DLA Piper LLP (US)

(57) ABSTRACT

There is presented a solar cell comprising a semiconductor substrate of one conductivity-type, a layer of the opposite conductivity-type provided on a surface side of the semiconductor substrate, a surface electrode formed thereon, and a backside electrode formed on a backside of the semiconductor substrate, wherein the semiconductor substrate is formed with protrusions and recesses on the surface side thereof, and spaces that are filled with a glass component of an electrode material of the surface electrode are present in bottom portions of the recesses. This arrangement has eliminated a conventional problem in that silver in the electrode material gets into the bottom portions of the recesses and causes defects to be generated in the recesses due to stress generated during forming of the electrode.

7 Claims, 9 Drawing Sheets

U.S. PATENT DOCUMENTS

| | | | |
|---|---|---|---|
| 5,972,527 | A | 10/1999 | Kaijou et al. |
| 6,071,753 | A | 6/2000 | Arimoto |
| 6,214,636 | B1 * | 4/2001 | Sawayama et al. ............. 438/57 |
| 6,238,965 | B1 | 5/2001 | Lee et al. |
| 2001/0016426 | A1 | 8/2001 | Lee et al. |

FOREIGN PATENT DOCUMENTS

| | | |
|---|---|---|
| JP | 02-256280 | 10/1990 |
| JP | 03046985 A | 2/1991 |
| JP | 03502627 A | 6/1991 |
| JP | 05075152 A | 3/1993 |
| JP | 07-015022 | 1/1995 |
| JP | 09102625 A | 4/1997 |
| JP | 11-017202 | 1/1999 |
| JP | 11307792 A | 11/1999 |
| JP | 2000049368 A | 2/2000 |
| JP | 2000-277778 | 10/2000 |
| JP | 2000277778 A | 10/2000 |
| JP | 2000-332279 | 11/2000 |
| JP | 2001-015782 | 1/2001 |
| JP | 2001015782 A | 1/2001 |
| JP | 2001-127317 | 5/2001 |
| JP | 2001-189473 | 7/2001 |

OTHER PUBLICATIONS

E. Vazsonyi et al, "Improved anisotropic etching process for industrial texturing of silicon solar cells", Sol. Energy Mat. Sol. Cells, 57, 179-188. (1999).

J. Mandelkorn et al, "The JCT Buried BSF Silicon Solar Cell A Model of Simplicity and High Efficiency", $1^{st}$ WCPEC, p. 1470-1472 (Dec. 5-9, 1994).

Y. Nishimoto et al, "Investigation of texturization for crystalline silicon solar cells with sodium carbonate solutions", Sol. Energy Mat. Sol. Cells, 61, 393-402 (2000).

Ruby, D.S. et al, "Recent Progress on the Self-Aligned, Selective-Emitter Silicon Solar Cell", $26^{th}$ PVSC, p. 39-42. (Sep. 30-Oct. 3, 1997).

S. Arimoto et al, "Simplified Mass-Production Process for 16% Efficiency Multi-Crystalline Si Solar Cells", Conf. Rec. $28^{th}$ IEEE Photovoltaic Specialists Conf. p. 188-193, Sep. 2000.

D.L. King et al, "Experimental Optimization of an Anisotropic Etching Process for Random Texturization of Silicon Solar Cells", Conf. Rec. $22^{nd}$ IEEE Photovoltaic Specialists Conf. p. 303-308, Oct. 1991.

T.A. Nguty et al, "The rheological properties of solder and solar pastes and the effect on stencil printing", Rheol. Acta. 39, 607-612 (2000).

J. Hoornstra et al, "The Importance of Paste Rheology in Improving Fine Line, Thick Film Screen Printing of Front Side Metalization", Proc. $14^{th}$ Eur. Photovoltaic Sol. Energy Conf., Jun. 30-Jul. 7, 1997, Barcelona, Spain. 4 pages.

Phillips, J.M. et al. "Zinc-indium-oxide: A high conductivity transparent conducting oxide" Appl. Phys. Lett. 67 (15) 2246-2248: (Oct. 1995).

D. Jousse, et al. "Highly conductive and transparent amorphous tin oxide" J. Appl. Phys. 54 (1) 431-434. (Jan. 1983).

Bellingham, J.R. et al. "Electrical and optical properties of amorphous Indium oxide" J. Phys.: Condens. Matter 2, 6207-6221. (1990, month not available).

Minami, T. "Transparent conducting oxide semiconductors for transparent electrodes" Semicond. Sci. Technol. 20, S35-S44. (Mar. 2005).

T. Nunio et al. "High Performance BSF Silicon Solar Cell with Fire Through Contacts Printed on AR coating" IEEE Proceedings of 14th PVSC, 1980, pp. 805-810.

A.D. Haigh "Fired Through Printed Contacts on Antireflection Coated Silicon Terrestrial Solar Cells" Photovoltaic Specialists Conference, 12th, Baton Rouge, La., Nov. 15-18, 1976, Conference Record. (A78-10902 01-44) New York, Institute of Electrical and Electronics Engineers, Inc., 1976, p. 360, 361.

R. Mertens et al, "Critical Processing Parameter Optimization for Screen Printed Semicrystalline Silicon Solar Cells", Conf. Rec. Seventeenth IEEE Photovoltaic Specialists Conf.—1984, p. 1347-1351, May 1984.

German language office action dated Jun. 15, 2011 and its English language translation for corresponding German application 10250815.1 cites the foreign patent document above.

German language office action dated 201111-14 and its English language translation for corresponding German application 10250815.1.

* cited by examiner

SOLAR CELL, MANUFACTURING METHOD THEREOF AND ELECTRODE MATERIAL

This application is a divisional of Ser. No. 10/278,757, filed Oct. 22, 2002 now abandoned, which is based on applications Nos. 2001-326832, 2001-352818, and 2002-067444 filed in Japan, the content of which is incorporated hereinto by reference.

BACKGROUND OF THE INVENTION

1. Field of the Invention

The present invention relates to a solar cell with a semiconductor substrate whose surface is formed with microscopic protrusions and recesses for reducing reflection of light, a manufacturing method thereof, and an electrode material used for the solar cell.

2. Description of the Related Art

Solar cells include solar cells using monocrystal line semiconductor substrates, those using polycrystalline semiconductor substrates, and those using amorphous semiconductor substrates. In view of mass production productivity, the best of these are the solar cells using polycrystalline semiconductor substrates.

In order to improve the efficiency of such solar cells using polycrystalline semiconductor substrates, various approaches have been made.

One example of these is forming microscopic protrusions and recesses on the surface of the semiconductor substrate so as to introduce as much light incident on the solar cell as possible into the semiconductor substrate, and to trap as much light introduced into the semiconductor substrate as possible within the semiconductor substrate.

Such microscopic protrusions and recesses are formed, for example, by the Reactive Ion Etching: RIE method. By this method, it is possible to form uniform protrusions and recesses on the surface and reduce surface reflection more effectively even when polycrystalline silicon is used for the semiconductor substrate, irrespective of the irregular plane directions of the crystals.

(A) However, since such microscopic protrusions and recesses formed on the surface of the silicon substrate have heights of as small as 2 $\mu$m or less and pitches between protrusions and recesses of as small as 0.2 to 2.0 $\mu$m, they are susceptible to impact and stress.

Accordingly, when conductive paste such as silver paste is applied by printing followed by firing to such microscopic protrusions and recesses formed by the above method, if the silver paste fills the bottom portions of the microscopic recesses without allowing clearance, the microscopic protrusions and recesses collapse due to stress during the firing, resulting in generation of a great number of defects such as micro cracks in the bottom portions. The electric properties are therefore deteriorated. When this kind of defects are generated in areas below an electrode, occurrence of recombination of carriers increases, causing the electric properties, in particular, the open circuit voltage to drop.

(B) Meanwhile, there has been a process in which a silicon substrate is provided with a diffusion layer containing an opposite conductivity type impurity, over which a silicon nitride film, silicon dioxide or titanium dioxide film or the like is formed as an antireflective film.

A process has been proposed for formation of an electrode on this antireflective film, in which partial removal of the antireflective film is not performed and an electrode material in paste form is printed over the antireflective film and then fired as it is.

That is, by fusing by heat the paste-form electrode material applied by printing to the antireflective film simultaneously with fusing the material of the antireflective film located beneath the electrode material, the electrode material and the silicon substrate are bonded together so that an ohmic contact is accomplished between the electrode material and silicon (fire through method).

For this electrode material, for instance, an electrode material in paste form composed of 100 weight parts of silver powder with particle sizes of about 0.1-2 $\mu$m, 10-30 weight parts of an organic vehicle and 0.1-5 weight parts of glass frit is used.

However, when this method is employed in a solar cell having a diffusion layer containing an opposite conductivity type impurity which is formed on microscopic protrusions and recesses on a silicon substrate to a thickness of as thin as 0.2-0.5 $\mu$m, it is difficult to stably fuse the material of the antireflective film, and as a result, there could be cases where semiconductor junctions between the shallow diffusion layer and the silicon substrate are destroyed.

In such a case, the fill factor of the solar cell characteristics is lowered, and accordingly output power of the solar cell is reduced.

Even when lowering in the fill factor of the solar cell characteristics does not arise, the bonding strength between the semiconductor substrate and the electrode is so poor that inconveniences arise in the assembly and testing process.

(C) It has been known that when a solar cell is produced by forming a diffusion layer containing an opposite conductivity type impurity on the surface of a silicon substrate, forming an antireflective film which also functions as a passivation film, over the diffusion layer, and forming an electrode on top of them, shallowing the depth of the impurity diffused on the surface of the silicon substrate causes the sheet resistance to increase so that a great deal of current and high voltage can be obtained.

However, it becomes difficult to fuse the material of the antireflective film without destroying the semiconductor junctions so as to establish good contact between the electrode and silicon.

It is an object of this invention to provide a solar cell in which the conventional problem in that electrode material, silver, is trapped in the recessed areas of the microscopic protrusions and recesses and causes defects to be generated in the microscopic protrusions and recesses located below the electrode due to stress generated during firing of the electrode has been eliminated, a manufacturing method thereof, and an electrode material for use therein.

It is another object of this invention to provide a solar cell having both excellent characteristics and electrode strength by reducing the surface reflectance and without requiring a complicated process.

BRIEF SUMMARY OF THE INVENTION

A solar cell according to the present invention comprises a semiconductor substrate whose surface side is provided with microscopic protrusions and recesses, in which space that is filled with glass component of an electrode material are present in bottom portions of the recesses.

When the glass component of electrode material gets into the bottom portions of the recesses, defects are generated in the recesses due to stress generated during firing of the electrode. Such a conventional problem can be eliminated by this invention.

As a result, the reflectance of sunlight is reduced, and a highly efficient solar cell with improved open circuit voltage can be realized.

In addition, in a method of manufacturing a solar cell according to this invention, microscopic protrusions and recesses are formed on the surface side of a semiconductor substrate by dry etching. Accordingly, even when polycrystalline silicon is used for the semiconductor substrate, microscopic protrusions and recesses can be formed uniformly all over the substrate. As a result, the efficiency of a solar cell using polycrystalline semiconductor substrate can be greatly improved.

Furthermore, an electrode material according to the present invention comprises silver as a main component, wherein 5 or less weight parts in 100 weight parts of the silver have particle sizes of 0.1-1.0 μm. Accordingly, the silver particles of electrode material can be prevented from getting into the bottom portions of the recessed areas of the protrusions and recesses, enabling formation of spaces filled with glass component of the electrode material. Generation of crystal defects in the protrusions and recesses can therefore be prevented so that a highly efficient solar cell with high open circuit voltage can be produced.

In a solar cell according to the present invention, an opposite conductivity type dopant is contained in a surface of a semiconductor substrate such that the surface of the semiconductor substrate has a sheet resistance of 60-300 ohms/square, and an electrode formed over an area of the semiconductor substrate comprises metal composed of one or a plurality of elements selected from among Ti, Bi, Co, Zn, Zr, Fe and Cr, or an oxide thereof in an amount of 0.05-5 weight parts as metal per 100 weight parts of silver. With this structure, a solar cell having good electric properties as well as an electrode with high tensile strength can be realized.

In a solar cell according to the present invention, when an antireflective film of silicon nitride formed on the surface of a silicon substrate having numerous microscopic protrusions and recesses is etched by using a 32° C. aqueous solution in which the ratio of hydrofluoric acid containing 46% of hydrogen fluoride to water is 1:2, the etching rate is 350 Å/min or less. This enables production of a solar cell with high conversion efficiency, significantly contributing to improvement in efficiency of silicon solar cells.

Structural details of the present invention are now described referring to the appended drawings.

DETAILED DESCRIPTION OF THE INVENTION

First Embodiment

Figure 1:
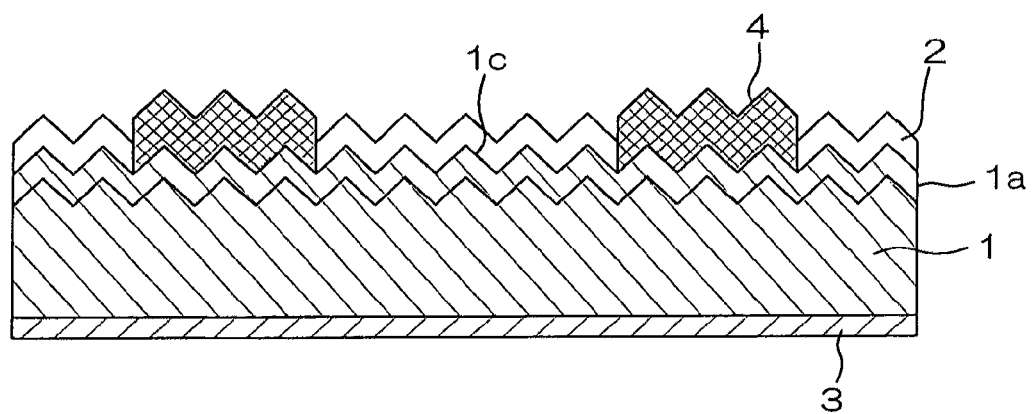
FIG. 1 is a cross-sectional view of a solar cell according to a first embodiment of this invention.

FIG. 1 is a cross-sectional view showing a solar cell according to this invention.

In FIG. 1, the reference numerals 1, 1a, 2, 3, and 4 denote a semiconductor substrate of one conductivity type, an area of the opposite conductivity type in the semiconductor substrate 1, an antireflective film, an electrode on the back side, and an electrode on the surface side, respectively.

The semiconductor substrate 1 comprises monocrystal line or polycrystalline silicon, monocrystal line gallium arsenide (GaAs) or the like. Polycrystalline silicon can be mass-produced and therefore advantageous over monocrystal silicon and monocrystal gallium arsenide in terms of production cost.

The semiconductor substrate 1 is formed by the Czochralski method or the like when monocrystal line silicon or monocrystal line gallium arsenide is used, and it is formed by a casting method or the like when polycrystalline silicon is used.

When the semiconductor substrate 1 is formed using silicon, a semiconductor dopant of one conductivity type such as boron(B) is added to the silicon at a concentration of about $1 \times 10^{16} - 1 \times 10^{18}$ atoms/cm$^3$ so as to obtain a substrate of one conductivity type having a resistivity of 1.5 ohm-cm.

The block obtained by the Czochralski method or a casting method is cut into a size of about 10 cm×10 cm or 15 cm×15 cm, and then it is sliced into pieces of about 300-500 μm in thickness.

The surface of the semiconductor substrate 1 is provided with numerous microscopic protrusions and recesses 1c. These microscopic protrusions and recesses 1c are provided in a solar cell to cause multiple reflection of light incident on the surface of the silicon substrate 1 so as to reduce surface reflection.

When a solar cell is fabricated using silicon, microscopic protrusions and recesses are formed on the surface by etching the surface of the silicon substrate 1 with an alkali aqueous solution such as a sodium hydroxide so that reflection of light at the surface of the substrate 1 can be reduced to a certain extent.

When a monocrystal line silicon substrate with (100) orientation is used, a pyramid pattern structure, which is called a "textured structure" can be formed uniformly on the surface of the substrate by the process mentioned above.

However, when a solar cell is fabricated with a polycrystalline silicon substrate, since etching with an alkali aqueous solution is dependent on the crystal orientation, it is impossible to uniformly form such a pyramid pattern structure. For this reason, effective reduction of the overall reflectance is also impossible.

To overcome such a problem, when a solar cell is fabricated with a polycrystalline silicon substrate, it is desirable to form microscopic protrusions and recesses 1c on the surface of the polycrystalline silicon substrate 1 by the Reactive Ion Etching (RIE) method. By this method, it is possible to form microscopic protrusions and recesses 1c uniformly without being influenced by the irregular orientations of crystal planes in polycrystalline silicon. Accordingly, the reflectance can be more effectively reduced.

Generally, in the RIE method, a gas is introduced into an evacuated chamber, and RF power is applied to an electrode provided in the chamber with the pressure being kept at a certain level, thereby causing a plasma to be generated, so that by the action of the generated active species including ions and radicals, the surface of the substrate is etched.

Figure 2:
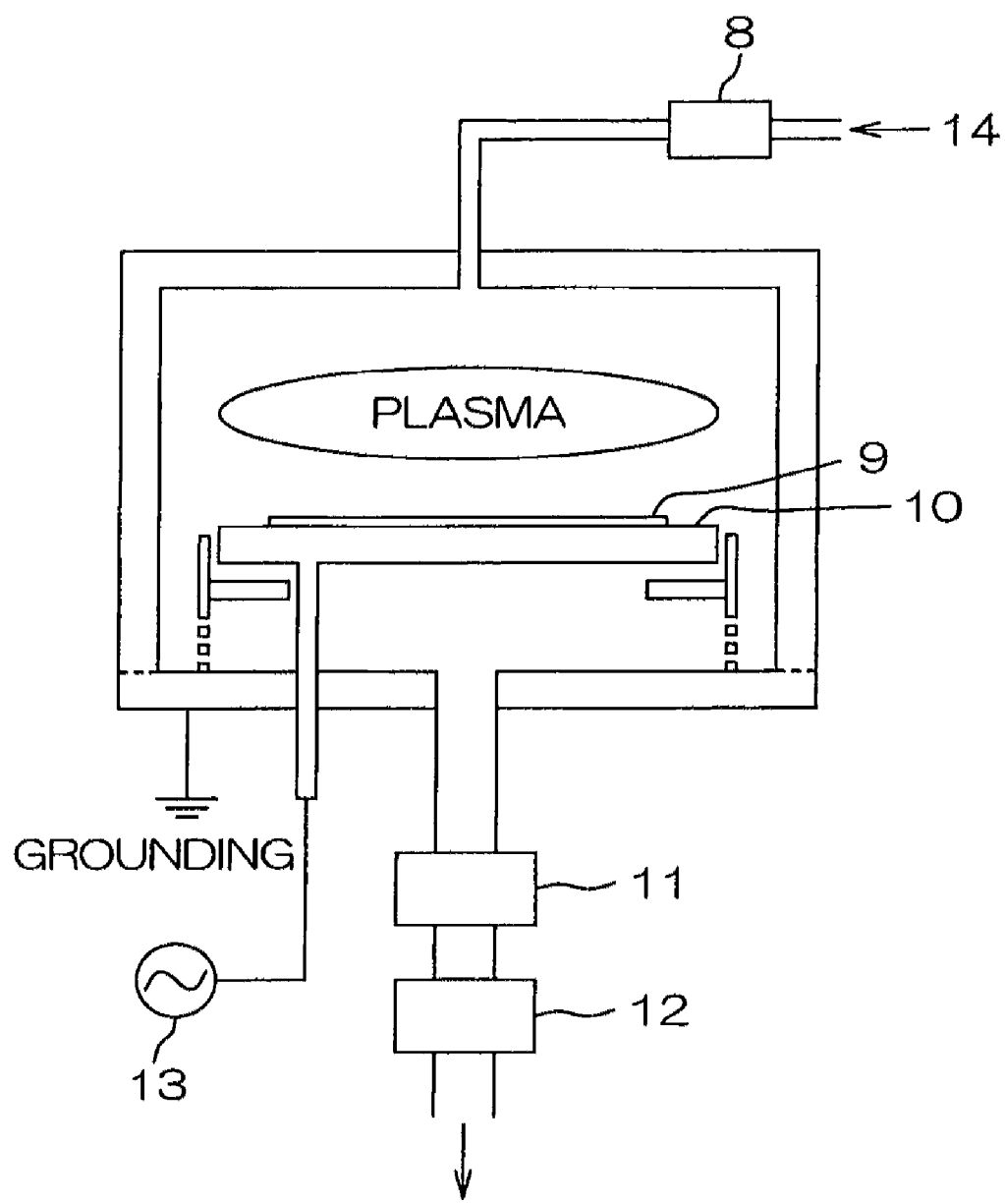
FIG. 2 illustrates an example of reactive ion etching system.
Figure 3:
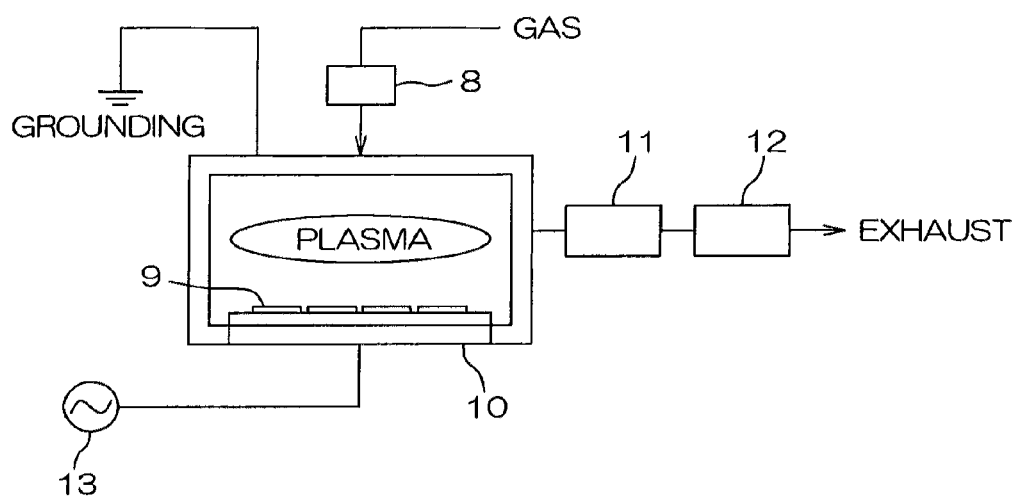
FIG. 3 illustrates another example of reactive ion etching system.

This process is shown in FIGS. 2 and 3. In the systems in these drawings, a gas is introduced through a mass flow controller 8 into a chamber evacuated by a vacuum pump 12, and while the pressure is kept at a certain level by a pressure regulator 11, RF power is applied to a RF electrode 10 inside the chamber so as to generate a plasma, thereby performing an etching.

In general, an etching method in which the effect of the action of ions on the etching is larger than the effect of the other active species is called reactive ion etching. Although there are other similar methods such as plasma etching, basically the principle of generation of plasma is the same, while the distribution of active species acting on the substrate is varied by changing the chamber structure or electrode structure. Accordingly, the present invention is applicable to a solar cell in which formation of the protrusions and recesses on the surface of the substrate is performed not only by the reactive ion etching method, but by the wide variety of plasma etching methods.

In this invention, for example, with oxygen ($O_2$) and $SF_6$ being introduced at flow rates of 10 sccm (standard cubic centimeter per minute) and 80 sccm, respectively, an etching is carried out for 5 minutes at a reaction pressure of 7 Pa and a RF power of 800 W to generate a plasma. As a result, microscopic protrusions and recesses 1c are formed on the surface of the silicon substrate 1.

When viewed in vertical cross section, these microscopic protrusions and recesses have a configuration of a row of conical or pyramidal shapes. The sizes of these can be varied by controlling the gas concentration or etching time in the RIE method.

The width (w) and height (h) (see FIG. 4) of each of these microscopic protrusions and recesses 1c are preferably 2 μm or less, respectively. When the width w and height h of each of the microscopic protrusions and recesses are more than 2 μm, time for the etching process is prolonged, while the reflectance at the surface of the substrate 1 is not reduced appreciably. In order to form the microscopic protrusions and recesses 1c all over the surface side of the silicon substrate 1 with uniformity, precision, and controllability, the width w and height h are preferably 1 μm or less. In addition, when the width w and height h are less than 0.2 μm, the junction becomes much susceptible to impact and stress, and is not preferable.

The aspect ratio (height h/width w) of the microscopic protrusions and recesses 1c is preferably 0.1 to 2. When the aspect ratio is less than 0.1, for instance, the average reflectance of light at wavelengths of 500-1000 nm is on the order of 25%, which means the reflectance at the surface of the semiconductor substrate 1 is large. When the aspect ratio is more than 2, the microscopic protrusions and recesses 1c are broken in the manufacturing process. As a result, current leakage in the manufactured solar cell is increased, and therefore it is impossible to obtain good output property.

On the surface side of the silicon substrate 1, an impurity diffusion layer 1a of the opposite conductivity-type is formed. The impurity diffusion layer 1a is provided for forming semiconductor junctions in the silicon substrate 1. To take the case of the diffusion of an n-type dopant, a process such as vapor phase diffusion using $POCl_3$, coating diffusion using $P_2O_5$, or ion implantation in which $P^+$ ions are directly diffused is used to form the impurity diffusion layer. The layer 1a containing an impurity of the opposite conductivity type is formed to have a depth of about 0.2-0.5 μm, and a sheet resistance of 60 ohms/square or more.

On the surface side of the semiconductor substrate 1, an antireflective film 2 is further provided. This antireflective film 2 comprises, for example, a silicon nitride film.

This antireflective film 2 is provided for preventing light from being reflected at the surface of the semiconductor substrate 1 so as to effectively bring the light inside the semiconductor substrate 1, and for passivating crystal defects inside the semiconductor substrate 1.

When a silicon substrate is used as the semiconductor substrate 1, the reflectance of the antireflective film 2 is determined, taking the difference in refractive indices between it and the silicon substrate 1 and the like into consideration, to be about 1.8-2.3 times the refractive index of the silicon substrate 1. The antireflective film 2 is formed to have a thickness of about 850 Å.

On the backside of the semiconductor substrate 1, a backside electrode 3 is formed. This backside electrode 3 is formed with a thickness of about 10-20 μm by applying an electrode material to the backside by printing and firing, in which the electrode material comprises 100 weight parts of a silver powder having particle sizes of about 0.1-5.0 μm, 10-30 weight parts of an organic vehicle, and 0.1-5.0 weight parts of glass frit.

On the surface side of the semiconductor substrate 1, a surface electrode 4 is formed with a thickness of about 10-20 μm.

Figure 4:
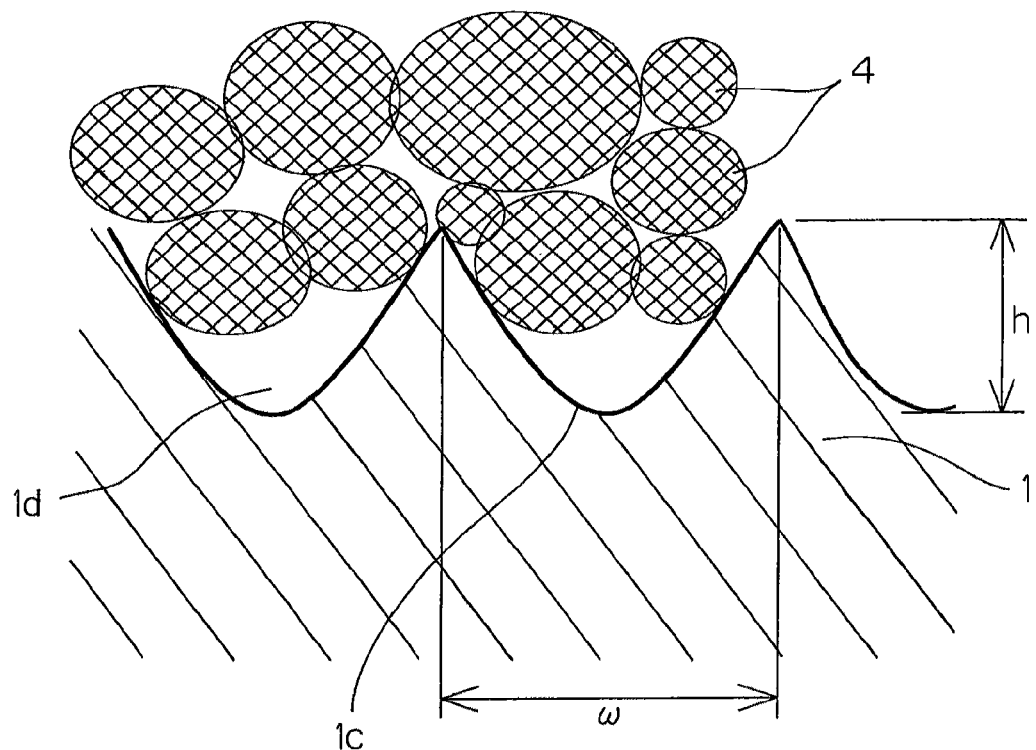
FIG. 4 is an enlarged sectional view of protrusions and recesses on the surface side of a solar cell according to the first embodiment of this invention.
Figure 5:
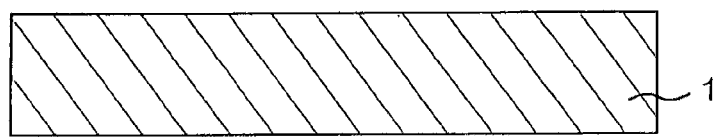
FIGS. 5 (a)-5(d) are sectional views illustrating a method of manufacturing process of solar cells.
Figure 5:
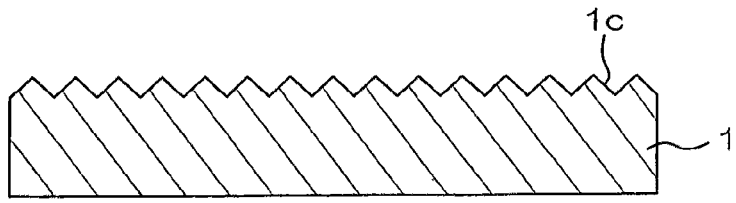
Figure 5:
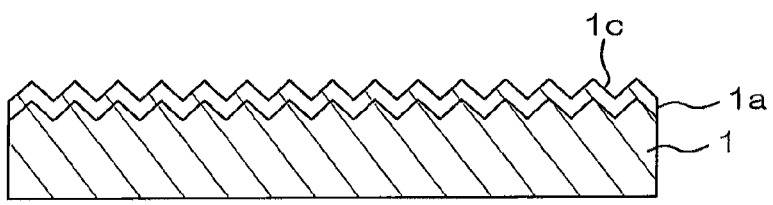
Figure 5:
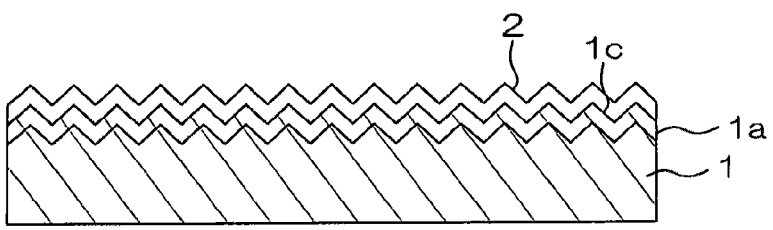
Figure 6:
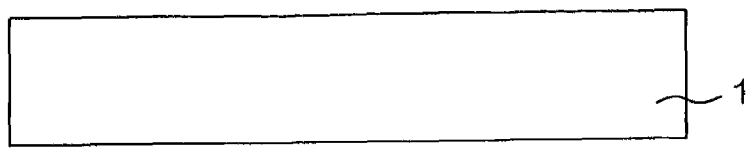
FIGS. 6 (a)-6(e) are sectional views illustrating process by process a method of manufacturing a solar cell according to a second embodiment of this invention.
Figure 6:
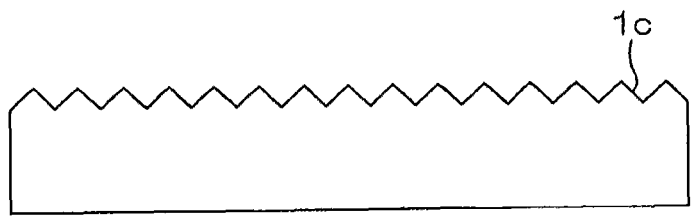
Figure 6:
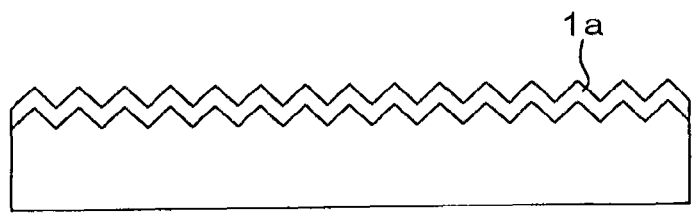
Figure 6:
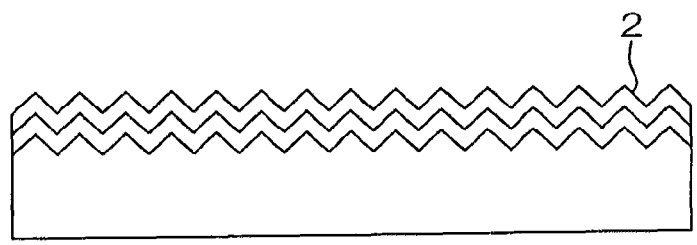
Figure 6:
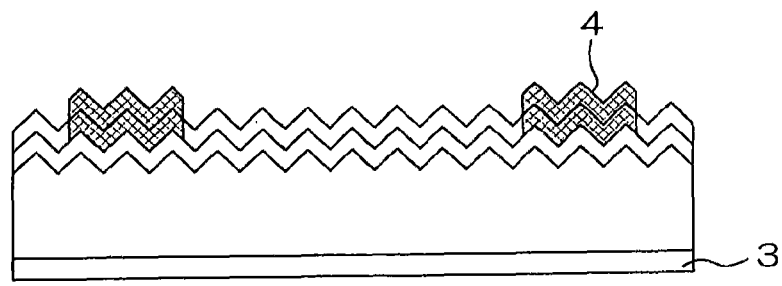

In the present invention, as shown in FIG. 4, spaces 1d which are filled with the glass component (glass frit) of the sliver paste are present in bottom portions of the recesses 1c on the surface of the semiconductor substrate 1.

The surface electrode 4 is formed by applying silver paste comprising silver powder having particle sizes of 0.1-5 μm. It is preferable that 5 or less weight parts in 100 weight parts of the silver powder have particle sizes of 0.1-1.0 μm. When more than 5 weight parts of the silver powder have particle sizes of 0.1-1.0 μm, the electrode material gets into the bottom portions of the recesses 1c. As a result, a large number of defects such as micro cracks are generated in the recesses 1c during firing of the silver powder, increasing the chances of recombination of carriers. The electric properties of the solar cell, especially the open circuit voltage, are therefore lowered.

This space filled with glass frit of the silver paste can be formed at the bottom portions of the recesses 1C by raising viscosity of the sliver paste.

A method of manufacturing a solar cell according to this invention is now described referring to FIGS. 5(a)-5(d).

First, a silicon semiconductor substrate 1 is prepared. (See FIG. 5(a).) This semiconductor substrate 1 includes an impurity of one conductivity type at a density of about $1 \times 10^{16}$-$1 \times 10^{18}$ atoms/$cm^3$. This semiconductor substrate 1 is formed by cutting a silicon block formed by the Czochralski method or a casting method into the size of 10 cm×10 cm or 15 cm×15 cm and then slicing it into pieces having a thickness of about 300-500 μm.

Then, numerous microscopic protrusions and recesses 1c are formed on the surface side of the silicon substrate 1. (See FIG. 5 (b).) These microscopic protrusions and recesses can be formed by a dry etching process such as the RIE method.

The sizes of the protrusions and recesses 1c can be varied by controlling the gas concentration or etching time in the RIE method.

Subsequently, the silicon substrate 1 is disposed inside a diffusion furnace. Then, $N_2$ gas or the like is introduced in the diffusion furnace through bubbling in phosphorous oxychloride($POCl_3$) or the like, and heated so that phosphorous atoms are diffused in the surface area of the wafer 1, thereby forming an area 1a of the opposite conductivity type. By this thermal diffusion, the area of the opposite conductivity type and a phospho-silicate glass layer (not shown) comprising phosphorous atoms are formed over all outer surfaces of the silicon substrate 1. The phospho-silicate glass layer and the opposite conductivity area except for the opposite conductivity area 1a on the surface side of the silicon substrate 1 are removed by dipping in an etchant composed mainly of hydrofluoric acid(HF) and nitric acid ($HNO_3$). Thereafter it is cleaned with pure water. (FIG. 5 (c))

Then, an antireflective film 2 is formed on the surface side of the silicon substrate 1. (FIG. 5(d)) This antireflective film 2 is formed by the plasma CVD method using a mixture of silane ($SiH_4$) gas and ammonia ($NH_3$) gas or the like.

Subsequently, as shown in FIG. 1, after material of the backside electrode 3 is applied and dried, material of the surface electrode 4 is applied and dried, and then electrode patterns are attached by firing at 600-800° C. for about 1-30 minutes, thereby completing fabrication of a solar cell.

EXAMPLE 1

The surface side of a silicon substrate having a resistivity of 1.5 ohm-cm was finely roughened by dry etching. Then, phosphorous was diffused at a density of $1 \times 10^{17}$ atoms/cm$^3$. An antireflective film comprising a silicon nitride film was formed with a thickness of 850 Å. Thereafter, silver paste comprising silver particles having particles sizes of about 0.1-5 μm was applied to the substrate such that the weight ratio of silver particles having sizes of 0.1-1.0 μm was varied as 0%, 2%, 4%, 5%, 6%, and 10%. Each of the silver paste was fired at 750° C. for 15 minutes, thereby forming an electrode area of a semiconductor device. The open circuit voltage was measured in each case, the results of which are shown in Table 1.

TABLE 1

| WEIGHT RATIO OF SILVER POWDER OF 0.1-1.0 μm IN SIZE (%) | OPEN CIRCUIT VOLTAGE (mV) |
|---|---|
| 0 | 612 |
| 2 | 612 |
| 4 | 611 |
| 5 | 610 |
| 6 | 607 |
| 10 | 605 |

When the weight ratio of the silver particles having sizes of 0.1-1.0 μm was 2%, the open circuit voltage was 612 mV. When the weight ratio of the silver particles having sizes of 0.1-1.0 μm was 5%, the open circuit voltage was 610 mV. However, the open circuit voltage decreases when the weight ratio of the silver particles having sizes of 0.1-1.0 μm was 6% or more. The open circuit voltage at the weight ratio of 10% was 605 mV.

Second Embodiment

FIGS. 6(a)-6(e) illustrate a manufacturing process of a solar cell according to the present invention.

First, a semiconductor substrate 1 is prepared. (See FIG. 6(a).) This semiconductor substrate 1 comprises polycrystalline silicon or the like. This semiconductor substrate 1 includes an impurity of one conductivity type at a density of about $1 \times 1.0^{14}$ atoms/cm$^3$ and has a resistivity of about 1.5 ohm-cm. This semiconductor substrate 1, when it is polycrystalline silicon, is formed by cutting a silicon block formed by a casting method into the size of 10 cm×10 cm or 15 cm×15 cm and then slicing it into pieces having a thickness of about 300 μm.

Numerous microscopic protrusions and recesses 1c are formed on the surface side of the silicon substrate 1. (See FIG. 6 (b).) The microscopic protrusions and recesses 1c are provided to cause multiple reflection of light incident on the surface side of the semiconductor substrate so as to reduce the surface reflection. The microscopic protrusions and recesses 1c have a configuration of conical shapes or rows of conical shapes.

The microscopic protrusions and recesses 1c are formed, for example, by the RIE method. The sizes of the microscopic protrusions and recesses 1c can be varied by controlling the gas condition or etching time in the RIE method. The width w and height h of each of the microscopic protrusions and recesses 1c (See FIG. 4.) are 2 μm or less, respectively. When the width w and height h of each of the microscopic protrusions and recesses 1c are more than 2 μm, the etching time is prolonged, while the reflectance at the surface of the substrate 1 is not reduced appreciably. In order to form the microscopic protrusions and recesses 1c all over the surface side of the silicon substrate 1 with uniformity, precision, and controllability, the width w and height h are preferably 1 μm or less. Although the effect of reducing the reflectance is still attainable when the sizes of the microscopic protrusions and recesses are very small, the production becomes difficult when they are too small. The sizes of the microscopic protrusions and recesses 1c are preferably 1 nm or more in order to be formed with uniformity and precision within the surface area.

The aspect ratio (height h/width w) of the microscopic protrusions and recesses 1c is preferably 0.1-2. When the aspect ratio is less than 0.1, for instance, the average reflectance of light at wavelengths of 500-1000 nm is on the order of 25%, which means the reflectance at the surface of the semiconductor substrate 1 is large. When the aspect ratio is more than 2, the microscopic protrusions and recesses 1c are broken in the manufacturing process. As a result, current leakage in the manufactured solar cell is increased, and therefore it is impossible to obtain good output property.

On the surface side of the silicon substrate 1, a diffusion layer 1a including a dopant of the opposite conductivity-type diffused therein is formed. (FIG. 6(C)) The impurity diffusion layer 1a is provided for forming semiconductor junctions in the silicon substrate 1. To take the case of diffusion of an n-type impurity, a process such as vapor phase diffusion using $POCl_3$, coating diffusion using $P_2O_5$, or ion implantation in which $P^+$ ions are directly diffused is used to form the impurity diffusion layer. The layer 1a containing an impurity of the opposite conductivity type is formed to have a depth of about 0.2-0.5 μm.

In a solar cell according to this invention, the sheet resistance of the surface side area of the semiconductor substrate 1 formed with numerous microscopic protrusions and recesses 1c is set in the range of 60-300 ohms/square. These are values that are measured by the four-points probe method.

In the four-points probe method, four metal probes are aligned collinearly on a surface of a semiconductor substrate 1, and brought in contact with one another while being pressed. A voltage generated between the inner two probes when an electric current is passed between the outer two probes is measured, and the resistance is obtained from the voltage and the current according to the Ohm's Law.

When the sheet resistance of the surface area of the semiconductor substrate 1 formed with numerous microscopic protrusions and recesses 1c is in the range of 60-300 ohms/square, short-circuit current in the fabricated solar cell can be greatly increased.

The reason for this is given as follows. When a surface of a semiconductor substrate is provided with the microscopic protrusions and recesses 1c as above, impurity of the opposite conductivity type is more easily diffused in the surface area of the semiconductor substrate 1 than when such microscopic protrusions and recesses 1c are not formed. When the impurity of the opposite conductivity type is diffused deep in the surface area so that sheet resistance of the surface is 60 ohms/square or less, semiconductor junctions are formed in deep areas far from the surface of the semiconductor substrate 1. This makes it hard for light to reach the semiconductor junctions, which is considered to be the reason for the short circuit current not being increased.

Therefore, in the present invention, for the semiconductor substrate 1 whose surface is provided with the numerous microscopic protrusions and recesses 1c, the sheet resistance of the surface area of the semiconductor substrate 1 is set to be 60 to 300 ohms/square so that semiconductor junctions are formed in relatively shallow areas in the semiconductor substrate 1, thereby increasing the short circuit current value. The sheet resistances can be varied, for example, by lowering temperature of the substrate or reducing diffusion time.

When the sheet resistance of the substrate surface is lower than 60 ohms/square, the short circuit current value decreases, and when it is more than 300 ohms/square, it becomes difficult to evenly diffuse the impurity of the opposite conductivity type all over the surface side of the substrate 1, which is unfavorable.

Then, an antireflective film 2 is formed over the surface of the semiconductor substrate 1. (FIG. 6 (d)) This antireflective film 2 is provided for preventing light to be reflected at the surface of the semiconductor substrate 1 so as to effectively bring the light inside the semiconductor substrate 1. The index of refraction and the thickness of the antireflective film 2 are determined taking the difference in refraction between it and the semiconductor substrate 1 and the like into consideration. For instance, a silicon nitride($SiN_x$) film, silicon dioxide ($SiO_2$) film or titanium dioxide($TiO_2$) film is used.

On the backside of the semiconductor substrate, a layer (not shown) in which an impurity of one conductivity type is diffused at a high concentration is preferably formed. This layer including an impurity of one conductivity type diffused at a high concentration has the function to form an internal electric field on the backside of the semiconductor substrate 1 so as to prevent lowering of the efficiency due to recombination of carriers in the vicinity of the backside of the semiconductor substrate 1. Accordingly, carriers generated in the vicinity of the backside surface of the semiconductor substrate 1 are effectively outputted. In particular, the spectral response at longer wavelengths is enhanced. In such a semiconductor substrate whose backside surface is provided with a layer in which an impurity of one conductivity type is diffused at a high concentration, the sheet resistance of the backside surface is on the order of 15 ohms/square.

Subsequently, after a backside electrode material is applied to the backside surface and dried, a surface electrode material is applied to the surface side of the substrate and dried. (See FIG. 6 (e).) For example, screen printing is used for application of the electrode materials.

The electrode material is in the form of paste, which comprises 100-weight parts of silver, and 10-30 weight parts of an organic vehicle and 0.1-5 weight parts of glass frit added thereto.

The above mentioned organic vehicle is a resin for making powdery material into paste form, which is, for example, a cellulosic resin or an acrylic resin. Since such resins are decomposed and evaporate at temperatures around 400° C., the components thereof do not remain in the electrode after firing.

The glass frit is used to provide the electrode attached by firing with strength. The glass frit contains boron, silicon and the like whose softening points vary in a range of about 300-600° C. Because a part of the glass frit remains in the electrode and another part of it acts on the substrate, it has the function to bond the electrode with the substrate.

According to the present invention, the surface electrode material comprises one or a plurality of elements selected from among Ti, Bi, Co, Zn, Zr, Fe and Cr in an amount of 0.05-5 weight parts as metal per 100 weight parts of silver. The reason for including these elements will be described later.

When the amount is less than 0.05 weight parts or more than 5 weight parts, the fill factor of the solar cell deteriorates.

The above mentioned Ti, Bi, Co, Zn, Zr, Fe, and Cr may be contained in the paste in any form of the following: metal powder, oxide powder, organometallic compound and inorganic compound.

The backside electrode 3 and surface electrode 4 are fabricated by firing the applied backside electrode material and surface electrode material at a temperature of 600-800° C. for 1-30 minutes or so. The backside electrode 3 and surface electrode 4 are coated with a solder when the need arises.

When the surface electrode 4 is fired, it forms an ohmic contact with the diffusion layer 1a.

Now, the reason for including Ti, Bi, Co, Zn, Zr, Fe, and Cr in the surface electrode material is now described.

As stated above, the solar cell according to the present invention has the semiconductor substrate 1 whose surface is formed with numerous microscopic protrusions and recesses 1c. The sheet resistance of the surface area of the semiconductor substrate 1 is set to be 60 to 300 ohms/square so that semiconductor junctions are formed in relatively shallow area of the semiconductor substrate 1, thereby intending to increase the short circuit current value. Accordingly, when conventional paste is used, the glass frit bonds the electrode 4 and the substrate 1 so firmly that sometimes semiconductor junctions are destroyed.

To deal with this problem, the action of the glass frit to bond the electrode 4 and substrate 1 is controlled by adding Ti, Bi, Co, Zn, Zr, Fe or Cr to the surface electrode material in an appropriate amount. As a result, the bonding strength and contact performance can be improved without destroying the junctions as compared with conventional cases.

Each component listed above acts on the glass frit during the firing and a part of it melts into the glass frit. Thereafter, the mixture of the component and the glass frit acts on the silicon nitride film or silicon oxide film constituting the antireflective film 2. This action is more stable than when such a component as above is not included. In other words, including the above-listed components promotes melting the silicon nitride film or silicon oxide film, and restrains melting the semiconductor substrate 1.

When any of these components Ti, Bi, Co, Zn, Zr, Fe and Cr is mixed in the form of powder such as metal powder and oxide powder, the average particle size is desirably in the range of 0.1-5 μm. This average particle size may be defined by Laser Scatting Particle-Size Distribution Analysis, Centrifugal Photo Sedimentation Analysis, an acoustic method, or a diffusion method.

When the average particle size is less than 0.1 μm, the dispersibility of the powder in the electrode material is so poor that it is impossible to obtain adequate bonding force (tensile strength) of the surface electrode 4. When the average particle size is more than 5 μm, the screen printing properties (such as line continuity and uniformity of the line width) deteriorate, therefore failing to obtain adequate bonding force of the surface electrode 4.

Incidentally, the backside electrode material may also contain Ti, Bi, Co, Zn, Zr, Fe and Cr similarly to the surface electrode material. It is preferable to contain these elements, because the bonding force of the backside electrode will also be enhanced.

EXAMPLE 2-1

A p-type substrate made of polycrystalline silicon having a thickness of 300 μm, a size of 15 cm×15 cm, and a resistivity of 1.5 ohm-cm was dipped in a solution of HNO, and HF mixed at 7:1 ratio so that one side of it was etched 15 μm in depth. Then, under flows of 12 sccm trifluoromethane ($CHF_3$), 72 sccm chlorine ($Cl_2$), 9 sccm oxygen ($O_2$), and 65 sccm sulfur hexafluoride($SF_6$), at a reaction pressure of 50 m Torr and a RF power of 500 W, microscopic protrusions and recesses were formed on the surface of the substrate by RIE.

Then phosphorous (n-type impurity) was diffused such that the sheet resistance of the surface area of the silicon substrate varied as 40, 60, 80, 100, and 120 ohms/square by varying temperature during diffusion.

Subsequently, aluminum paste was screen printed on the back surface of the silicon substrate, and baked at 750° C. The sheet resistance of the back surface was 15 ohms/square.

A SiN film having an index of refraction of 2.1, and a thickness of 800 Å was formed as an antireflective film by the plasma CVD method.

Thereafter, silver paste not containing other powder, or paste containing titanium oxide ($TiO_2$) powder having an average particle size of 1 μm was applied to the substrate and fired at 700° C., in which the titanium powder was contained in an amount of 0.04-5.5 weight parts as metal per 100 weight parts of silver. The electric properties of the solar cell and the strength of the electrode area were measured for each sample.

The results are shown in Table 2. The measurement of the strength was performed by applying a copper foil to the electrode area by soldering and lifting them vertically to observe the weight at which the copper foil peeled off or the cell broke.

[Table 2]

TABLE 2

ANTIREFLECTIVE FILM: SILICON NITRIDE ADDITIVE: TITANIUM OXIDE

| No. | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
|---|---|---|---|---|---|---|---|---|
| Ref | 40 | NONE | 7431 | 0.582 | 0.642 | 12.34 | 0.14 | X |
| Ref | 60 | | 7823 | 0.588 | 0.683 | 13.96 | 0.10 | X |
| Ref | 80 | | 7891 | 0.597 | 0.614 | 12.86 | 0.09 | X |
| Ref | 100 | | 7842 | 0.593 | 0.602 | 12.44 | 0.12 | X |
| Ref | 120 | | 7851 | 0.588 | 0.676 | 13.87 | 0.11 | X |
| T1 | 40 | 0.03 | 7521 | 0.595 | 0.702 | 13.96 | 0.18 | X |
| T2 | 60 | | 7915 | 0.604 | 0.708 | 15.04 | 0.19 | X |
| T3 | 80 | | 8103 | 0.609 | 0.711 | 15.59 | 0.17 | X |
| T4 | 100 | | 8109 | 0.610 | 0.713 | 15.67 | 0.19 | X |
| T5 | 120 | | 8007 | 0.609 | 0.712 | 15.43 | 0.19 | X |
| T6 | 40 | 0.05 | 7532 | 0.598 | 0.744 | 14.89 | 0.52 | ○ |
| T7 | 60 | | 7927 | 0.615 | 0.738 | 15.99 | 0.51 | ○ |
| T8 | 80 | | 8107 | 0.617 | 0.741 | 16.47 | 0.49 | ○ |
| T9 | 100 | | 8118 | 0.619 | 0.747 | 16.68 | 0.45 | ○ |
| T10 | 120 | | 8015 | 0.618 | 0.744 | 16.38 | 0.48 | ○ |
| T11 | 40 | 0.1 | 7535 | 0.597 | 0.747 | 14.93 | 0.69 | ○ |
| T12 | 60 | | 7924 | 0.619 | 0.748 | 16.31 | 0.48 | ○ |
| T13 | 80 | | 8108 | 0.623 | 0.749 | 16.82 | 0.74 | ○ |
| T14 | 100 | | 8120 | 0.625 | 0.745 | 16.80 | 0.68 | ○ |
| T15 | 120 | | 8055 | 0.618 | 0.747 | 16.53 | 0.43 | ○ |
| T16 | 40 | 0.5 | 7533 | 0.598 | 0.747 | 14.96 | 0.59 | ○ |
| T17 | 60 | | 7921 | 0.619 | 0.750 | 16.34 | 0.48 | ⊙ |
| T18 | 80 | | 8102 | 0.623 | 0.751 | 16.85 | 0.39 | ⊙ |
| T19 | 100 | | 8113 | 0.625 | 0.748 | 16.86 | 0.71 | ⊙ |
| T20 | 120 | | 8021 | 0.618 | 0.747 | 16.46 | 0.38 | ○ |
| T21 | 40 | 1 | 7532 | 0.597 | 0.751 | 15.01 | 0.49 | ○ |
| T22 | 60 | | 7920 | 0.617 | 0.747 | 16.22 | 0.65 | ○ |
| T23 | 80 | | 8109 | 0.620 | 0.750 | 16.76 | 0.51 | ○ |
| T24 | 100 | 1 | 8115 | 0.623 | 0.752 | 16.90 | 0.74 | ○ |
| T25 | 120 | | 8017 | 0.619 | 0.749 | 16.52 | 0.81 | ○ |
| T26 | 40 | 5 | 7532 | 0.598 | 0.743 | 14.87 | 0.48 | ⊙ |
| T27 | 60 | | 7951 | 0.610 | 0.743 | 16.02 | 0.52 | ○ |
| T28 | 80 | | 8107 | 0.617 | 0.745 | 16.56 | 0.61 | ○ |
| T29 | 100 | | 8118 | 0.619 | 0.745 | 16.64 | 0.91 | ○ |
| T30 | 120 | | 8015 | 0.618 | 0.740 | 16.29 | 0.49 | ○ |
| T31 | 40 | 6 | 7532 | 0.598 | 0.703 | 14.07 | 0.72 | ○ |

TABLE 2-continued

| | ANTIREFLECTIVE FILM: SILICON NITRIDE ADDITIVE: TITANIUM OXIDE | | | | | | | |
|---|---|---|---|---|---|---|---|---|
| No. | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
| T32 | 60 | | 7924 | 0.609 | 0.704 | 15.10 | 0.65 | ○ |
| T33 | 80 | | 8107 | 0.610 | 0.709 | 15.58 | 0.66 | ◉ |
| T34 | 100 | | 8118 | 0.611 | 0.703 | 15.50 | 0.81 | ○ |
| T35 | 120 | | 8015 | 0.610 | 0.705 | 15.32 | 0.59 | ○ |

STRENGTH GRADE
GOOD←◉ ○ X→POOR

The electrode strength and the ohmic contact were improved by addition of titanium oxide. As shown in Table 2, when titanium oxide was not added, the tensile strength was 0.09-0.18 kg. When the titanium oxide addition was 0.0.3 weight parts, the tensile strength was 0.17-0.19 kg, while the tensile strengths was 0.38-0.91 kg when the addition was 0.05-6 weight parts.

The conversion efficiency obtained when no powder was added was 12.34-13.96%, while it was 14.07-16.90% when the titanium oxide addition was 0.05-6 weight parts where good results were obtained in terms of tensile strength.

When the titanium oxide addition was 0.05-6 weight parts, the conversion efficiency was 14.07-15.01% at a sheet resistance of 40 ohms/square, while the conversion efficiency was 15.10-16.90% at a sheet resistance of 60-120 ohms/square.

Besides, the conversion efficiency was 15.10-15.58% when the titanium oxide addition was 6 weight parts and the sheet resistance was 60-120 ohms/square, while the conversion efficiency was 15.99-16.90% when the titanium oxide addition was 0.05-5 weight parts and the sheet resistance was 60-120 ohms/square.

According to the results in Table 2, good electrode strength and good ohmic contact were obtained when the titanium oxide addition was in the range of 0.05-5 weight parts and the sheet resistance was in the range of 60-120 ohms/square.

EXAMPLE 2-2

Powders of bismuth oxide, cobalt oxide, zinc oxide, zirconium oxide, iron oxide, and chrome oxide with an average particle size of 1 μm were each mixed with silver to form paste, in which each powder was mixed in an amount of 0.04-5.5 weight parts as metal per 100 weight parts of silver. Each of the paste was fired at 700° C., and the electric properties of the solar cell and the tensile strength of the electrode were measured for each sample, the results of which are shown in Tables 3-8.

Table 3 shows the results when bismuth oxide was contained.

TABLE 3

| | ANTIREFLECTIVE FILM: SILICON NITRIDE ADDITIVE: BISMUTH OXIDE | | | | | | | |
|---|---|---|---|---|---|---|---|---|
| No. | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
| B1 | 40 | 0.03 | 7498 | 0.594 | 0.701 | 13.88 | 0.12 | X |
| B2 | 60 | | 7913 | 0.601 | 0.706 | 14.92 | 0.11 | X |
| B3 | 80 | | 8100 | 0.605 | 0.71 | 15.46 | 0.19 | X |
| B4 | 100 | | 8102 | 0.611 | 0.712 | 15.87 | 0.16 | X |
| B5 | 120 | | 8003 | 0.612 | 0.712 | 15.50 | 0.17 | X |
| B6 | 40 | 0.05 | 7523 | 0.597 | 0.745 | 14.87 | 0.51 | ○ |
| B7 | 60 | | 7921 | 0.614 | 0.74 | 16.00 | 0.53 | ○ |
| B8 | 80 | | 8104 | 0.618 | 0.742 | 16.52 | 0.55 | ○ |
| B9 | 100 | | 8112 | 0.618 | 0.745 | 16.60 | 0.53 | ○ |
| B10 | 120 | | 8011 | 0.618 | 0.745 | 16.39 | 0.66 | ○ |
| B11 | 40 | 0.1 | 7531 | 0.598 | 0.745 | 14.91 | 0.59 | ◉ |
| B12 | 60 | | 7920 | 0.615 | 0.747 | 16.17 | 0.51 | ○ |
| B13 | 80 | | 8099 | 0.622 | 0.747 | 16.72 | 0.59 | ◉ |
| B14 | 100 | | 8117 | 0.623 | 0.746 | 16.77 | 0.61 | ◉ |
| B15 | 120 | | 8052 | 0.616 | 0.745 | 16.42 | 0.57 | ○ |
| B16 | 40 | 0.5 | 7531 | 0.597 | 0.746 | 14.91 | 0.55 | ○ |
| B17 | 60 | | 7912 | 0.617 | 0.749 | 16.25 | 0.42 | ○ |
| B18 | 80 | | 8107 | 0.622 | 0.747 | 16.74 | 0.4 | ○ |
| B19 | 100 | | 8119 | 0.624 | 0.748 | 16.84 | 0.57 | ◉ |
| B20 | 120 | | 8012 | 0.620 | 0.748 | 16.51 | 0.4 | ○ |
| B21 | 40 | 1 | 7535 | 0.595 | 0.748 | 14.90 | 0.39 | ○ |
| B22 | 60 | | 7916 | 0.619 | 0.745 | 16.22 | 0.51 | ○ |
| B23 | 80 | | 8101 | 0.622 | 0.747 | 16.73 | 0.57 | ○ |
| B24 | 100 | | 8112 | 0.621 | 0.748 | 16.75 | 0.66 | ◉ |
| B25 | 120 | | 8012 | 0.620 | 0.747 | 16.49 | 0.56 | ○ |
| B26 | 40 | 5 | 7523 | 0.597 | 0.744 | 14.85 | 0.43 | ○ |
| B27 | 60 | | 7912 | 0.611 | 0.749 | 16.09 | 0.39 | ◉ |
| B28 | 80 | | 8108 | 0.616 | 0.744 | 16.52 | 0.55 | ○ |
| B29 | 100 | 5 | 8118 | 0.617 | 0.744 | 16.56 | 0.73 | ○ |
| B30 | 120 | | 8013 | 0.617 | 0.742 | 16.30 | 0.47 | ○ |
| B31 | 40 | 6 | 7522 | 0.596 | 0.700 | 13.95 | 0.71 | ◉ |

TABLE 3-continued

ANTIREFLECTIVE FILM: SILICON NITRIDE ADDITIVE: BISMUTH OXIDE

| No. | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
|---|---|---|---|---|---|---|---|---|
| B32 | 60 |  | 7920 | 0.606 | 0.701 | 14.95 | 0.55 | ○ |
| B33 | 80 |  | 8099 | 0.612 | 0.707 | 15.57 | 0.61 | ◎ |
| B34 | 100 |  | 8108 | 0.614 | 0.705 | 15.60 | 0.7 | ○ |
| B35 | 120 |  | 8020 | 0.614 | 0.710 | 15.54 | 0.59 | ○ |

STRENGTH GRADE
GOOD←◎ ○ X→POOR

Table 4 shows the result when cobalt oxide was contained.

TABLE 4

ANTIREFLECTIVE FILM: SILICON NITRIDE ADDITIVE: COBALT OXIDE

| No. | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
|---|---|---|---|---|---|---|---|---|
| C1 | 40 | 0.03 | 7519 | 0.589 | 0.701 | 13.80 | 0.11 | X |
| C2 | 60 |  | 7917 | 0.602 | 0.707 | 14.98 | 0.15 | X |
| C3 | 80 |  | 8099 | 0.606 | 0.713 | 15.55 | 0.13 | X |
| C4 | 100 |  | 8093 | 0.609 | 0.713 | 15.62 | 0.11 | X |
| C5 | 120 |  | 7999 | 0.610 | 0.71 | 15.40 | 0.19 | X |
| C6 | 40 | 0.05 | 7539 | 0.595 | 0.741 | 14.77 | 0.59 | ○ |
| C7 | 60 |  | 7937 | 0.613 | 0.747 | 16.15 | 0.61 | ○ |
| C8 | 80 |  | 8099 | 0.618 | 0.744 | 16.55 | 0.42 | ○ |
| C9 | 100 |  | 8111 | 0.617 | 0.741 | 16.48 | 0.51 | ○ |
| C10 | 120 |  | 8012 | 0.618 | 0.741 | 16.31 | 0.41 | ○ |
| C11 | 40 | 0.1 | 7528 | 0.595 | 0.739 | 14.71 | 0.69 | ◎ |
| C12 | 60 |  | 7899 | 0.614 | 0.744 | 16.04 | 0.52 | ○ |
| C13 | 80 |  | 8098 | 0.629 | 0.748 | 16.93 | 0.49 | ○ |
| C14 | 100 |  | 8119 | 0.626 | 0.747 | 16.87 | 0.51 | ○ |
| C15 | 120 |  | 8039 | 0.620 | 0.744 | 16.48 | 0.57 | ○ |
| C16 | 40 | 0.5 | 7527 | 0.610 | 0.740 | 15.10 | 0.62 | ○ |
| C17 | 60 |  | 7953 | 0.617 | 0.747 | 16.29 | 0.68 | ○ |
| C18 | 80 |  | 8096 | 0620 | 0.749 | 16.71 | 0.41 | ○ |
| C19 | 100 |  | 8129 | 0.621 | 0.749 | 16.80 | 0.63 | ◎ |
| C20 | 120 |  | 8019 | 0.621 | 0.744 | 16.47 | 0.55 | ○ |
| C21 | 40 | 1 | 7611 | 0.589 | 0.743 | 14.80 | 0.57 | ○ |
| C22 | 60 |  | 7899 | 0.612 | 0.749 | 16.09 | 0.41 | ○ |
| C23 | 80 |  | 8094 | 0.618 | 0.752 | 16.72 | 0.47 | ○ |
| C24 | 100 |  | 8111 | 0.619 | 0.755 | 16.85 | 0.53 | ○ |
| C25 | 120 |  | 8039 | 0.622 | 0.751 | 16.69 | 0.71 | ○ |
| C26 | 40 | 5 | 7585 | 0.597 | 0.743 | 14.95 | 0.38 | ○ |
| C27 | 60 |  | 7952 | 0.609 | 0.745 | 16.03 | 0.62 | ○ |
| C28 | 80 |  | 8095 | 0.613 | 0.739 | 16.30 | 0.48 | ○ |
| C29 | 100 | 5 | 8099 | 0.620 | 0.744 | 16.60 | 0.66 | ◎ |
| C30 | 120 |  | 8025 | 0.619 | 0.733 | 16.18 | 0.52 | ○ |
| C31 | 40 | 6 | 7527 | 0.593 | 0.699 | 13.87 | 0.59 | ○ |
| C32 | 60 |  | 7852 | 0.606 | 0.705 | 14.91 | 0.61 | ○ |
| C33 | 80 |  | 8094 | 0.611 | 0.710 | 15.61 | 0.49 | ○ |
| C34 | 100 |  | 8112 | 0.612 | 0.714 | 15.75 | 0.71 | ◎ |
| C35 | 120 |  | 8041 | 0.613 | 0.707 | 15.49 | 0.64 | ◎ |

STRENGTH GRADE
GOOD←◎ ○ X→POOR

Table 5 shows the results when zinc oxide was contained.

TABLE 5

ANTIREFLECTIVE FILM: SILICON NITRIDE ADDITIVE: ZINC OXIDE

| No. | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
|---|---|---|---|---|---|---|---|---|
| N1 | 40 | 0.03 | 7520 | 0.595 | 0.7 | 13.92 | 0.17 | X |
| N2 | 60 |  | 7921 | 0.604 | 0.703 | 14.95 | 0.19 | X |
| N3 | 80 |  | 8092 | 0.609 | 0.709 | 15.53 | 0.15 | X |
| N4 | 100 |  | 8102 | 0.610 | 0.711 | 15.62 | 0.17 | X |

TABLE 5-continued

ANTIREFLECTIVE FILM: SILICON NITRIDE ADDITIVE: ZINC OXIDE

| No. | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
|---|---|---|---|---|---|---|---|---|
| N5  | 120 |      | 8048 | 0.609 | 0.703 | 15.31 | 0.12 | X |
| N6  | 40  | 0.05 | 7550 | 0.598 | 0.733 | 14.71 | 0.64 | ○ |
| N7  | 60  |      | 7872 | 0.615 | 0.747 | 16.07 | 0.66 | ○ |
| N8  | 80  |      | 8097 | 0.617 | 0.740 | 16.43 | 0.68 | ◎ |
| N9  | 100 |      | 8085 | 0.619 | 0.733 | 16.30 | 0.63 | ○ |
| N10 | 120 |      | 8013 | 0.618 | 0.738 | 16.24 | 0.69 | ○ |
| N11 | 40  | 0.1  | 7601 | 0.597 | 0.737 | 14.86 | 0.71 | ◎ |
| N12 | 60  |      | 7929 | 0.619 | 0.738 | 16.10 | 0.66 | ○ |
| N13 | 80  |      | 8093 | 0.623 | 0.738 | 16.54 | 0.77 | ○ |
| N14 | 100 |      | 8088 | 0.625 | 0.732 | 16.45 | 0.61 | ○ |
| N15 | 120 |      | 8042 | 0.618 | 0.735 | 16.24 | 0.63 | ○ |
| N16 | 40  | 0.5  | 7573 | 0.598 | 0.741 | 14.91 | 0.59 | ○ |
| N17 | 60  |      | 7919 | 0.619 | 0.738 | 16.08 | 0.64 | ○ |
| N18 | 80  |      | 8033 | 0.623 | 0.732 | 16.28 | 0.69 | ◎ |
| N19 | 100 |      | 8029 | 0.625 | 0.733 | 16.35 | 0.79 | ○ |
| N20 | 120 |      | 8018 | 0.618 | 0.735 | 16.19 | 0.52 | ○ |
| N21 | 40  | 1    | 7527 | 0.597 | 0.743 | 14.84 | 0.74 | ○ |
| N22 | 60  |      | 7942 | 0.617 | 0.739 | 16.09 | 0.59 | ○ |
| N23 | 80  |      | 8037 | 0.620 | 0.733 | 16.23 | 0.55 | ○ |
| N24 | 100 |      | 8022 | 0.623 | 0.737 | 16.37 | 0.71 | ◎ |
| N25 | 120 |      | 8009 | 0.619 | 0.739 | 16.28 | 0.66 | ○ |
| N26 | 40  | 5    | 7429 | 0.598 | 0.739 | 14.59 | 0.97 | ○ |
| N27 | 60  |      | 7997 | 0.610 | 0.738 | 16.00 | 0.49 | ○ |
| N28 | 80  |      | 8049 | 0.617 | 0.734 | 16.20 | 0.66 | ○ |
| N29 | 100 | 5    | 8039 | 0.619 | 0.732 | 16.19 | 0.81 | ○ |
| N30 | 120 |      | 8022 | 0.618 | 0.733 | 16.15 | 0.62 | ○ |
| N31 | 40  | 6    | 7522 | 0.598 | 0.704 | 14.07 | 0.49 | ○ |
| N32 | 60  |      | 7717 | 0.609 | 0.702 | 14.66 | 0.59 | ○ |
| N33 | 80  |      | 8003 | 0.615 | 0.700 | 15.31 | 0.44 | ○ |
| N34 | 100 |      | 8042 | 0.617 | 0.707 | 15.59 | 0.49 | ○ |
| N35 | 120 |      | 8088 | 0.616 | 0.704 | 15.59 | 0.62 | ◎ |

STRENGTH GRADE
GOOD←─ ◎ ○ X→POOR

Table 6 shows the results when zirconium oxide was contained.

TABLE 6

ANTIREFLECTIVE FILM: SILICON NITRIDE ADDITIVE ZIRCONIUM OXIDE

| No | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
|---|---|---|---|---|---|---|---|---|
| Z1  | 40  | 0.03 | 7433 | 0.592 | 0.699 | 13.67 | 0.19 | X |
| Z2  | 60  |      | 7902 | 0.600 | 0.713 | 15.02 | 0.17 | X |
| Z3  | 80  |      | 8039 | 0.604 | 0.704 | 15.19 | 0.11 | X |
| Z4  | 100 |      | 8028 | 0.602 | 0.705 | 15.14 | 0.15 | X |
| Z5  | 120 |      | 8019 | 0.601 | 0.705 | 15.10 | 0.16 | X |
| Z6  | 40  | 0.05 | 7529 | 0.593 | 0.749 | 14.86 | 0.69 | ○ |
| Z7  | 60  |      | 7987 | 0.618 | 0.746 | 16.37 | 0.72 | ○ |
| Z8  | 80  |      | 8033 | 0.607 | 0.744 | 16.12 | 0.55 | ○ |
| Z9  | 100 |      | 8042 | 0.615 | 0.743 | 16.33 | 0.59 | ◎ |
| Z10 | 120 |      | 8029 | 0.612 | 0.733 | 16.01 | 0.62 | ○ |
| Z11 | 40  | 0.1  | 7603 | 0.592 | 0.744 | 14.88 | 0.59 | ○ |
| Z12 | 60  |      | 7949 | 0.608 | 0.745 | 16.00 | 0.41 | ○ |
| Z13 | 80  |      | 8039 | 0.605 | 0.748 | 16.17 | 0.68 | ○ |
| Z14 | 100 |      | 8046 | 0.605 | 0.744 | 16.10 | 0.72 | ○ |
| Z15 | 120 |      | 8051 | 0.608 | 0.744 | 16.19 | 0.55 | ○ |
| Z16 | 40  | 0.5  | 7422 | 0.591 | 0.750 | 14.82 | 0.67 | ◎ |
| Z17 | 60  |      | 7915 | 0.604 | 0.754 | 16.02 | 0.56 | ○ |
| Z18 | 80  |      | 8029 | 0.603 | 0.747 | 16.07 | 0.41 | ○ |
| Z19 | 100 |      | 8031 | 0.604 | 0.744 | 16.04 | 0.44 | ○ |
| Z20 | 120 |      | 8022 | 0.608 | 0.745 | 16.15 | 0.52 | ○ |
| Z21 | 40  | 1    | 7459 | 0.597 | 0.754 | 14.92 | 0.77 | ○ |
| Z22 | 60  |      | 7901 | 0.604 | 0.755 | 16.01 | 0.63 | ○ |
| Z23 | 80  |      | 8029 | 0.607 | 0.749 | 16.22 | 0.64 | ◎ |
| Z24 | 100 |      | 8032 | 0.605 | 0.744 | 16.07 | 0.71 | ○ |
| Z25 | 120 |      | 8029 | 0.607 | 0.746 | 16.16 | 0.59 | ○ |
| Z26 | 40  | 5    | 7459 | 0.600 | 0.742 | 14.76 | 0.51 | ○ |

TABLE 6-continued

ANTIREFLECTIVE FILM: SILICON NITRIDE ADDITIVE ZIRCONIUM OXIDE

| No | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
|---|---|---|---|---|---|---|---|---|
| Z27 | 60 |   | 7921 | 0.607 | 0.749 | 16.01 | 0.67 | ○ |
| Z28 | 80 |   | 8039 | 0.605 | 0.747 | 16.15 | 0.61 | ○ |
| Z29 | 100 | 5 | 8022 | 0.606 | 0.744 | 16.07 | 0.74 | ○ |
| Z30 | 120 |   | 8051 | 0.605 | 0.742 | 16.08 | 0.57 | ○ |
| Z31 | 40 | 6 | 7492 | 0.597 | 0.707 | 14.05 | 0.48 | ○ |
| Z32 | 60 |   | 7893 | 0.604 | 0.703 | 14.90 | 0.55 | ○ |
| Z33 | 80 |   | 8051 | 0.608 | 0.696 | 15.14 | 0.48 | ○ |
| Z34 | 100 |   | 8033 | 0.605 | 0.703 | 15.18 | 0.66 | ◎ |
| Z35 | 120 |   | 8021 | 0.606 | 0.701 | 15.14 | 0.51 | ○ |

STRENGTH GRADE
GOOD←◎ ○ X→POOR

Table 7 shows the results when iron oxide was contained.

TABLE 7

ANTIREFLECTIVE FILM: SILICON NITRIDE ADDITIVE: IRON OXIDE

| No. | SHEET RESISTANCE Ω/□ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
|---|---|---|---|---|---|---|---|---|
| F1 | 40 | 0.03 | 7429 | 0.586 | 0.705 | 13.64 | 0.11 | X |
| F2 | 60 |   | 7911 | 0.597 | 0.702 | 14.74 | 0.13 | X |
| F3 | 80 |   | 8053 | 0.603 | 0.703 | 15.17 | 0.13 | X |
| F4 | 100 |   | 8035 | 0.604 | 0.703 | 15.16 | 0.19 | X |
| F5 | 120 |   | 8029 | 0.603 | 0.701 | 15.08 | 0.17 | X |
| F6 | 40 | 0.05 | 7511 | 0.601 | 0.749 | 15.03 | 0.49 | ○ |
| F7 | 60 |   | 7927 | 0.601 | 0.756 | 16.01 | 0.51 | ○ |
| F8 | 80 |   | 8022 | 0.602 | 0.754 | 16.18 | 0.68 | ◎ |
| F9 | 100 |   | 8019 | 0.603 | 0.749 | 16.10 | 0.59 | ○ |
| F10 | 120 |   | 8017 | 0.603 | 0.749 | 16.09 | 0.55 | ○ |
| F11 | 40 | 0.1 | 7522 | 0.591 | 0.747 | 14.76 | 0.69 | ○ |
| F12 | 60 |   | 7893 | 0.619 | 0.747 | 16.22 | 0.49 | ○ |
| F13 | 80 |   | 8049 | 0.616 | 0.744 | 16.40 | 0.51 | ○ |
| F14 | 100 |   | 8044 | 0.614 | 0.747 | 16.40 | 0.62 | ○ |
| F15 | 120 |   | 8029 | 0.616 | 0.746 | 16.40 | 0.48 | ○ |
| F16 | 40 | 0.5 | 7447 | 0.597 | 0.745 | 14.72 | 0.55 | ○ |
| F17 | 60 |   | 7983 | 0.602 | 0.750 | 16.02 | 0.51 | ○ |
| F18 | 80 |   | 8018 | 0.603 | 0.749 | 16.09 | 0.72 | ◎ |
| F19 | 100 |   | 8022 | 0.603 | 0.747 | 16.06 | 0.49 | ○ |
| F20 | 120 |   | 8015 | 0.603 | 0.748 | 16.07 | 0.41 | ○ |
| F21 | 40 | 1 | 7555 | 0.591 | 0.753 | 14.94 | 0.49 | ○ |
| F22 | 60 |   | 7894 | 0.604 | 0.755 | 16.00 | 0.55 | ○ |
| F23 | 80 |   | 8037 | 0.605 | 0.745 | 16.10 | 0.61 | ○ |
| F24 | 100 |   | 8025 | 0.604 | 0.744 | 16.03 | 0.49 | ○ |
| F25 | 120 |   | 8019 | 0.603 | 0.746 | 16.03 | 0.77 | ◎ |
| F26 | 40 | 5 | 7438 | 0.597 | 0.745 | 14.70 | 0.65 | ○ |
| F27 | 60 |   | 7959 | 0.604 | 0.749 | 16.00 | 0.55 | ○ |
| F28 | 80 |   | 8008 | 0.603 | 0.747 | 16.03 | 0.79 | ◎ |
| F29 | 100 | 5 | 8012 | 0.604 | 0.749 | 16.11 | 0.45 | ○ |
| F30 | 120 |   | 8011 | 0.603 | 0.747 | 16.04 | 0.59 | ○ |
| F31 | 40 | 6 | 7438 | 0.592 | 0.702 | 13.74 | 0.71 | ◎ |
| F32 | 60 |   | 7984 | 0.603 | 0.705 | 15.08 | 0.38 | ○ |
| F33 | 80 |   | 8033 | 0.604 | 0.704 | 15.18 | 0.49 | ○ |
| F34 | 100 |   | 8050 | 0.603 | 0.706 | 15.23 | 0.58 | ○ |
| F35 | 120 |   | 8023 | 0.603 | 0.705 | 15.16 | 0.72 | ○ |

STRENGTH GRADE
GOOD←◎ ○ X→POOR

Table 8 shows the results when chromium oxide was contained.

TABLE 8

| | ANTIREFLECTIVE FILM: SILICON NITRIDE ADDITIVE CHROMIUM OXIDE | | | | | | | |
|---|---|---|---|---|---|---|---|---|
| No. | SHEET RESISTANCE $\Omega/\square$ | ADDITION PER 100 W/T PARTS SILVER | SHORT CIRCUIT CURRENT mA | OPEN CIRCUIT VOLTAGE V | FILL FACTOR | CONVERSION EFFICIENCY % | TENSILE STRENGTH Kg | EVALUATION OF STRENGTH |
| R1 | 40 | 0.03 | 7498 | 0.594 | 0.7 | 13.86 | 0.17 | X |
| R2 | 60 | | 7869 | 0.604 | 0.705 | 14.89 | 0.11 | X |
| R3 | 80 | | 7923 | 0.606 | 0.711 | 15.17 | 0.1 | X |
| R4 | 100 | | 7952 | 0.604 | 0.703 | 15.01 | 0.19 | X |
| R5 | 120 | | 7981 | 0.604 | 0.705 | 15.10 | 0.17 | X |
| R6 | 40 | 0.05 | 7518 | 0.584 | 0.749 | 14.62 | 0.49 | ○ |
| R7 | 60 | | 8015 | 0.609 | 0.739 | 16.03 | 0.51 | ○ |
| R8 | 80 | | 8028 | 0.608 | 0.738 | 16.01 | 0.48 | ○ |
| R9 | 100 | | 8042 | 0.606 | 0.740 | 16.03 | 0.33 | ○ |
| R10 | 120 | | 8033 | 0.605 | 0.742 | 16.03 | 0.51 | ○ |
| R11 | 40 | 0.1 | 7551 | 0.584 | 0.747 | 14.64 | 0.7 | ○ |
| R12 | 60 | | 7992 | 0.606 | 0.745 | 16.04 | 0.42 | ○ |
| R13 | 80 | | 8093 | 0.604 | 0.749 | 16.27 | 0.61 | ○ |
| R14 | 100 | | 8043 | 0.607 | 0.744 | 16.14 | 0.81 | ◎ |
| R15 | 120 | | 8039 | 0.606 | 0.742 | 16.07 | 0.37 | ○ |
| R16 | 40 | 0.5 | 7593 | 0.588 | 0.749 | 14.86 | 0.74 | ○ |
| R17 | 60 | | 7949 | 0.607 | 0.748 | 16.04 | 0.31 | ○ |
| R18 | 80 | | 8054 | 0.606 | 0.744 | 16.14 | 0.63 | ○ |
| R19 | 100 | | 8066 | 0.604 | 0.743 | 16.09 | 0.29 | ○ |
| R20 | 120 | | 8053 | 0.605 | 0.744 | 16.11 | 0.51 | ○ |
| R21 | 40 | 1 | 7591 | 0.583 | 0.750 | 14.75 | 0.49 | ○ |
| R22 | 60 | | 7994 | 0.606 | 0.747 | 16.08 | 0.81 | ◎ |
| R23 | 80 | | 8082 | 0.608 | 0.744 | 16.25 | 0.44 | ○ |
| R24 | 100 | | 8079 | 0.606 | 0.740 | 16.10 | 0.71 | ○ |
| R25 | 120 | | 8084 | 0.606 | 0.741 | 16.13 | 0.39 | ○ |
| R26 | 40 | 5 | 7579 | 0.588 | 0.748 | 14.82 | 0.71 | ○ |
| R27 | 60 | | 7991 | 0.606 | 0.749 | 16.12 | 0.29 | ○ |
| R28 | 80 | | 8049 | 0.603 | 0.748 | 16.14 | 0.64 | ○ |
| R29 | 100 | 5 | 8061 | 0.604 | 0.745 | 16.12 | 0.77 | ◎ |
| R30 | 120 | | 8075 | 0.604 | 0.744 | 16.13 | 0.35 | ○ |
| R31 | 40 | 6 | 7599 | 0.582 | 0.717 | 14.09 | 0.58 | ○ |
| R32 | 60 | | 7939 | 0.606 | 0.703 | 15.03 | 0.61 | ○ |
| R33 | 80 | | 8080 | 0.606 | 0.701 | 15.26 | 0.77 | ◎ |
| R34 | 100 | | 8075 | 0.604 | 0.703 | 15.24 | 0.38 | ○ |
| R35 | 120 | | 8095 | 0.603 | 0.700 | 15.19 | 0.44 | ○ |

STRENGTH GRADE
GOOD←◎ ○ X→POOR

COMPARATIVE EXAMPLE 2

Similar experiments were performed using the same metal powder and oxide powder whose average particle sizes were 0.05 μm. Irrespective of the contents, adequate strength was not obtained. When the average particle sizes of the metal powder and oxide powder were more than 5 μm, irrespective of the contents, a great deal of line break occurred during the screen printing, failing to obtain adequate electric properties.

Third Embodiment

Figure 7:
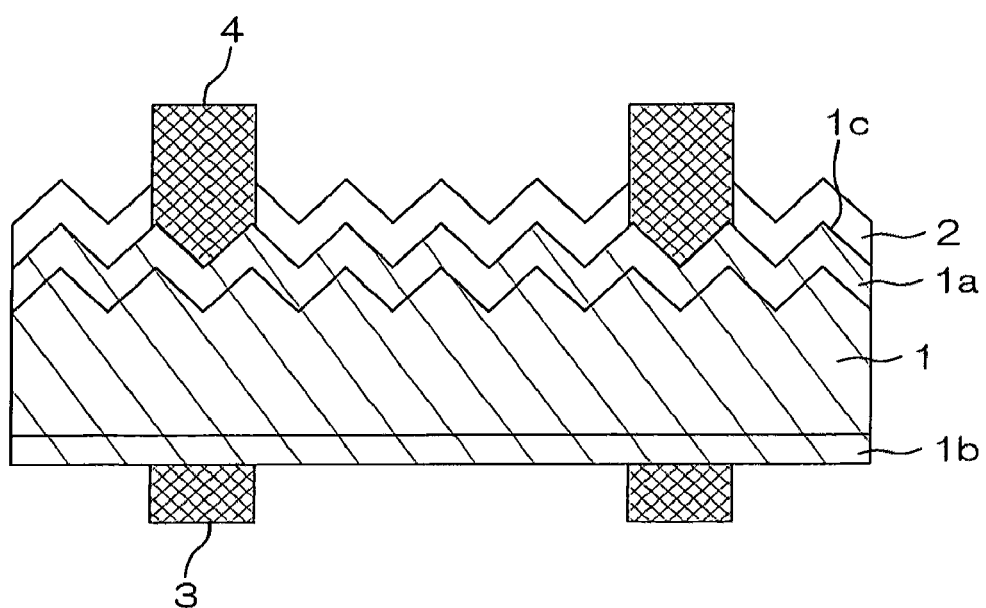
FIG. 7 illustrates the structure of a solar cell according to a third embodiment of this invention.

FIG. 7 shows the structure of a solar cell according to the present invention.

In FIG. 7, there are shown a silicon substrate 1, microscopic protrusions and recesses 1c, an impurity diffusion layer 1a on the light receiving side, an impurity diffusion layer 1b on the backside (BSF), an antireflective film 2 of silicon nitride, a surface electrode 4, and a backside electrode 3.

The silicon substrate 1 above is the same as those described in the first and second embodiments.

On the surface side of the silicon substrate 1, microscopic protrusions and recesses 1c are formed by reactive ion etching or the like so as to prevent incident light from being reflected and collect the light effectively.

Then, an antireflective film 2 is formed over the surface of the semiconductor substrate 1. This antireflective film 2 is provided for preventing light to be reflected at the surface of the semiconductor substrate 1 so as to effectively bring the light inside the semiconductor substrate 1. The index of refraction and the thickness of the antireflective film 2 are determined taking the difference in refraction between it and the semiconductor substrate 1 and the like into consideration. For instance, a silicon nitride ($SiN_x$) film, silicon dioxide ($SiO_2$) film or titanium dioxide ($TiO_2$) film is used.

In forming the protrusions and recesses 1c, the sizes of the protrusions and recesses 1c on the surface are preferably as small as 2.0 μm or less. By this arrangement, in the upper areas of the protrusions and recesses 1c, diffusion of phosphorous proceeds from both sides of the peak portions. The depth to which phosphorous is diffused is about 0.4 μm. Therefore, the impurity concentration rises and the resistance drops in the upper areas of the protrusions and recesses 1c.

Figure 8:
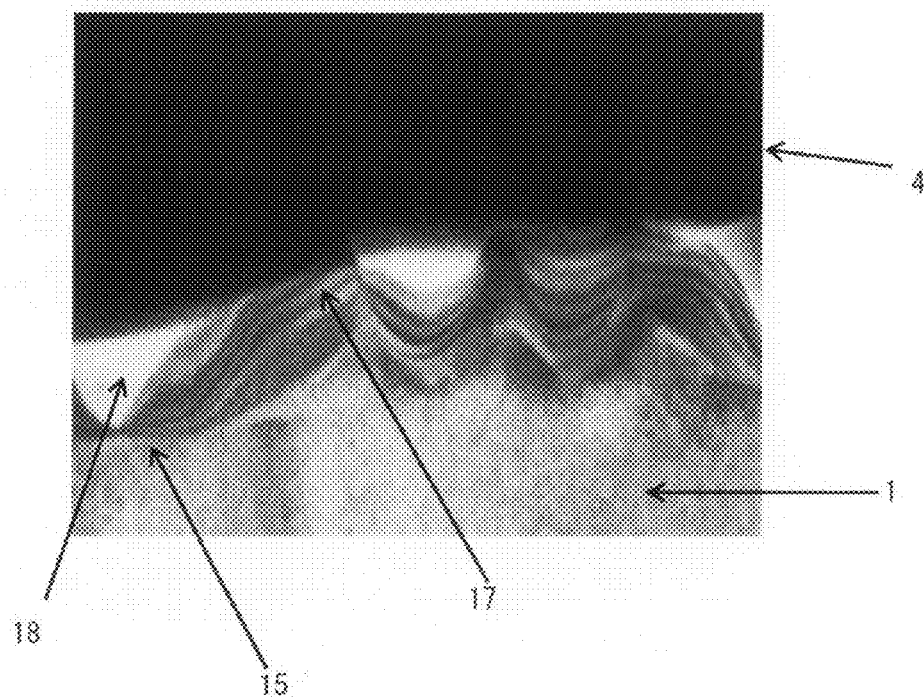
FIG. 8 is a TEM image showing a cross section of an interface between a surface electrode and silicon of a solar cell according to the third embodiment of this invention.

FIG. 8 is a TEM (Transmission Electron Microscope) image of a cross section of an interface between the silicon substrate and the surface electrode 4 that has been formed by screen-printing and firing silver paste.

In the recesses 15 of the protrusions and recesses 1c, portions 18 in which frit in the silver paste is deposited are present.

An upper area of the protrusions 17 of the protrusions and recesses 1c are in contact with silver in the electrode material. Phosphorous is diffused at high concentration in the protrusions 17 in contact with silver.

Accordingly, even in a case where silver paste was directly screen-printed on a silicon nitride film 2 with a slow etching rate, which is formed at a higher temperature or at a gas condition of richer silicon than conventional cases, and fired to form an electrode in the manner of so-called fire through method, the PN junctions are hard to be destroyed.

In addition, since the contact resistance between silver and silicon is greatly reduced, even when the sheet resistance of the surface of the silicon substrate 1 is increased due to the formation of numerous microscopic protrusions and recesses 1c, it is possible to manufacture solar cells with high efficiency at low cost.

On the surface side of the silicon substrate 1, an impurity diffusion layer 1a of the opposite conductivity type is formed with a prescribed depth.

In addition, an antireflective film 2 of silicon nitride is formed over the protrusions and recesses 1c on the surface of the silicon substrate 1.

Hereinafter, a detailed description on this antireflective film 2 will be given.

A silicon nitride film having inside a hydrogen concentration of $1.0 \times 10^{22}$-$1.0 \times 10^{23}$ atoms/cm$^3$ is formed as antireflective film by plasma CVD method.

When the hydrogen concentration inside the film is less than $1.0 \times 10^{22}$ atoms/cm$^3$, the passivation effect by the antireflective film is so inadequate that the properties drop. On the other hand, a hydrogen concentration inside the film exceeding $1.0 \times 10^{23}$ atoms/cm$^3$ does not lead to greater passivation effect, but rather causes increase in the reaction gas usage during the film formation, and makes control of the film forming conditions difficult, which result in deterioration in productivity.

In the formation of a conventional antireflective film, when etching was performed using a 32° C. aqueous solution in which the ratio of hydrofluoric acid containing 46% of hydrogen fluoride to water is 1:2, the etching rate was 400 Å/min.

In this embodiment, formation of the antireflective film 2 of silicon nitride is controlled such that the etching rate is 350 Å/min or less when etching is performed by using a 32° C. aqueous solution in which the ratio of hydrofluoric acid containing 46% of hydrogen fluoride to water is 1:2. In order to obtain an etching rate of 350 Å/min or less, the temperature for forming the silicon nitride film 2 needs to be in the range of 350-600° C., while conventionally, it is 300° C.

At temperatures below 350° C., due to inadequate diffusion rates of hydrogen in the silicon substrate 1, the passivation effect is too low to obtain sufficient improvements in the properties. At temperature above 600° C., bow of the silicon substrate 1 due to heat during the film formation is so great that it causes inconveniences such as uneven distribution of the film, and fragility of the silicon substrate 1 resulted from distortion by the bow.

By optimizing the etching rate, further improved properties can be achieved.

Diffusion of hydrogen inside the antireflective film 2 of silicon nitride into the silicon substrate 1 is promoted through the crystal-defects generated mainly in the recesses of the previously formed protrusions and recesses 1c. Such micro cracks (crystal-defects) are generated when the protrusions and recesses are formed on the silicon substrate 1, especially at the recesses of deeply etched protrusions and recesses due to the damage of etching. With a TEM observation, the length or width of the micro cracks are up to 0.1 to 1 μm. Thus, passivation of impurities and crystal defects in the bulk of the silicon substrate 1 is made more effective with the invention.

In general, when the index of refraction of an antireflective film is represented by n, and the thickness thereof is represented by d, and the index of refraction of substances surrounding the solar cell, the index of refraction of the silicon substrate, and the wavelength of the incident light are represented by $n_0$, $n_1$, $\lambda$, respectively, it is preferable to form an antireflective film where $n=\sqrt{(n_0 \cdot n_1)}$, and $4nd=\lambda$.

Since the index of refraction of the silicon substrate 1 is about 3.5, the index of refraction of the antireflective film 2 is preferably about 1.8-2.2, and the thickness thereof is preferably about 600-900 Å when the solar cell is surrounded by the air. ($n_0=1$).

To take the case of a module structure comprising solar cells, generally, glass and a resin filler such as ethylene vinyl acetate are attached over the solar cells, and incident light is absorbed by the solar cells through these. Since the indexes of refraction of glass and the filler are on the order of 1.5, the index of refraction of the solar cells is preferably 2.2-2.6.

Incidentally, since the surface of the silicon substrate 1 is roughened, antireflection effect can be obtained from the surface of the silicon substrate itself. Accordingly, sufficient antireflection effect can be attained even when the thickness of the antireflective film is reduced. Even a thickness of the antireflective film as thin as 50 Å will not cause the properties to drop. Similarly, when the thickness is made as large as 900 Å, lowering of the antireflection effect is smaller than when the surface of the silicon substrate 1 is not roughened. Significant deterioration of the properties does not occur until the thickness is about 1200 Å.

Therefore, taking the effect of antireflection, it is preferable to form silicon nitride film 2 having an index of refraction of 1.8-2.6, and a thickness of 50-1200 Å.

Incidentally, this method of forming an antireflection film is only an example, and is not limited to this specific one. As mentioned previously, by changing the gas conditions, RF power, or by combining various conditions including temperature so as to set the conditions for the film formation to specific values, it is possible to optimize the combination of the index of refraction, thickness, etching rate and the like, thereby achieving excellent properties.

On the backside of the semiconductor substrate, a layer 2b in which an impurity of one conductivity type is diffused at a high concentration is preferably formed. This layer 2b including an impurity of one conductivity type diffused at a high concentration has the function to form an internal electric field on the backside of the semiconductor substrate 1 so as to prevent lowering of the efficiency due to recombination of carriers in the vicinity of the backside of the semiconductor substrate 1. In other words, carriers generated in the vicinity of the backside surface of the semiconductor substrate 1 are effectively outputted. In particular, the sensitivity at long wavelengths is enhanced. In such a semiconductor substrate 1 whose backside surface is provided with the layer 2b in which an impurity of one conductivity type is diffused at a high concentration, the sheet resistance of the backside surface is on the order of 15 ohms/square.

On the surface side and backside of the silicon substrate 1, the surface electrode 4 and the backside electrode 3 are formed, respectively. These surface electrode 4 and backside electrode 3 are formed by screen printing and baking Ag paste, which is a mixture of Ag powder, binder, frit and the like, and then by forming solder layers on top of them. The surface electrode 4 comprises, for instance, a large number of finger electrodes formed with a width of about 200 μm, and a pitch of about 3 mm, and two bus bar electrodes that interconnect the large number of finger electrodes.

The backside electrode 3 comprises, for instance, a large number of finger electrodes formed with a width of about 300 µm, and a pitch of about 5 mm, and two bus bar electrodes that interconnect the large number of finger electrodes.

For improvement of the properties, it is possible to form an extracting electrode composed mainly of silver on the backside, together with a collecting electrode mainly composed of aluminum on almost the entire backside area other than the area where the extracting electrode is formed. In that case, it is not necessary to form the layer 2b in which an impurity of one conductivity type is diffused at high concentration before the formation of the electrode.

EXAMPLE 3 one side of a substrate made of polycrystalline silicon of 15 cm×15 cm in size having a thickness of 300 µm and a resistivity of 1.5 ohm-cm was etched to a depth of 15 µm by dipping in a solution in which the ratio of $HNO_3$ to HF is 7:1.

Then, under flows of 10 sccm oxygen ($O_2$) and 80 sccm sulfur hexafluoride($SF_6$), at a reaction pressure of 7 Pa and a RF power of 800 W, microscopic protrusions and recesses were formed on the surface of the substrate by RIE.

Thereafter, phosphorous (P) was diffused in the surface area of the silicon substrate so that the surface area had a sheet resistance of 80 ohms/square. Subsequently, aluminum paste was screen printed on the backside of the silicon substrate and fired at 750° C. The sheet resistance of the backside surface was 15 ohms/square.

Subsequently, a silicon nitride film was formed on the surface side of the silicon substrate by plasma CVD. In the formation of the silicon nitride film, the hydrogen content was varied in five different values by changing the gas conditions and the like, where the conditions are arranged such that the film had an index of refraction of 2.0-2.4 and a thickness of 800-900 Å. The temperature for the film formation was 500° C.

Then, silver (Ag) was applied to both the surface side and backside of the substrate by screen printing and fired so as to form electrodes. Solder layers were formed on the surfaces of the electrodes by a solder dip method, thereby fabricating a solar cell.

Figure 9:
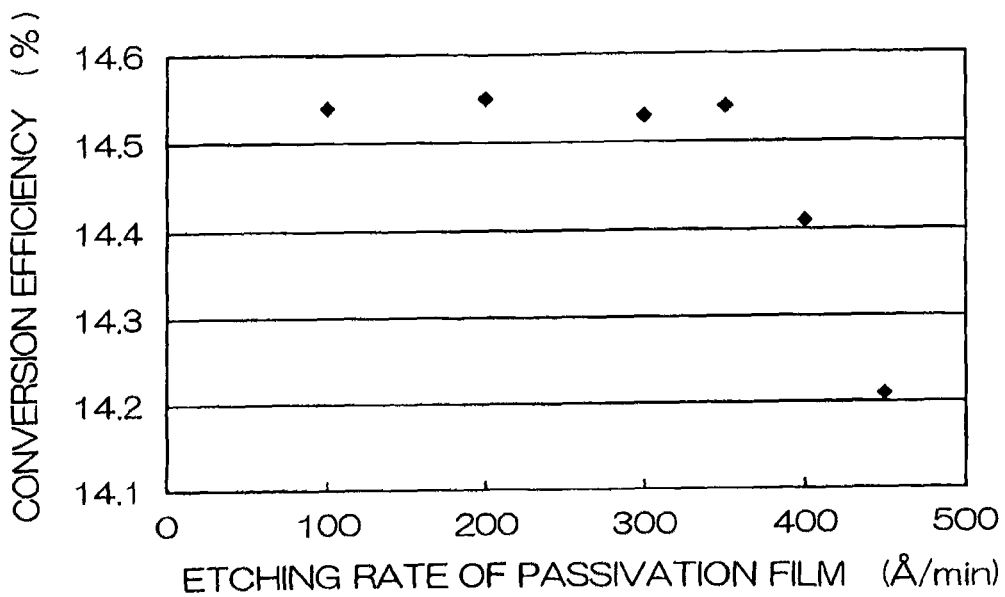
FIG. 9 is a graph showing the relationship between the etching rate of an antireflective film of silicon nitride and an electric property of a solar cell according to the third embodiment of this invention.

The relationship between the etching rate of the antireflective film of silicon nitride and the solar cell property (conversion efficiency), when etching was performed with a 32° C. aqueous solution in which the ratio of hydrofluoric acid containing 46% of hydrogen fluoride to water was 1:2, is shown in FIG. 9.

The conversion efficiency, which was 14.21% when the etching rate was 450 Å/min, rose as the etching rate decreased, and exceeded 14.5% when the etching rate was less than 350 Å/min. Like this, explicit correlation between the etching rate and conversion efficiency is observed. That is, when etching was performed using a 32° C. aqueous solution in which the ratio of hydrofluoric acid containing 46% of hydrogen fluoride to water was 1:2, the electric property was enhanced when the etching rate of the antireflective film was less than 450 Å/min.

Figure 10:
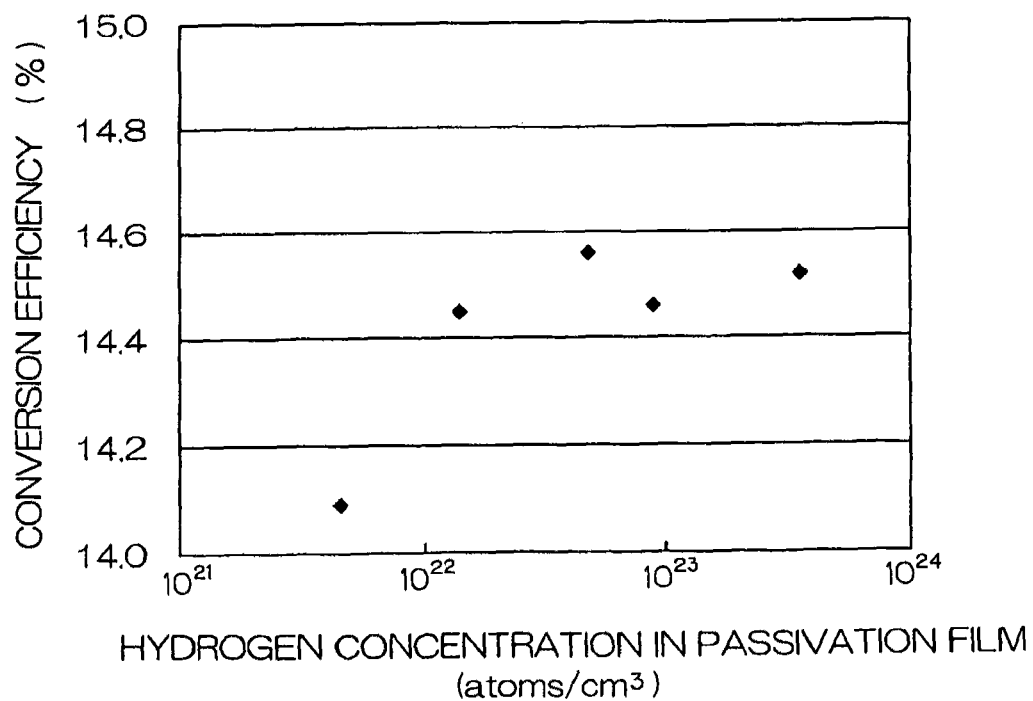
FIG. 10 is a graph showing the relationship between the hydrogen concentration in an antireflective film of silicon nitride and an electric property of a solar cell according to the third embodiment of this invention.

FIG. 10 shows the relationship between the hydrogen content in the antireflective film made of silicon nitride and the electric property (conversion efficiency).

The hydrogen content in the antireflective film was measured by secondary ion mass spectrometry. The thickness and index of refraction were measured with an ellipsometer.

As is apparent from FIG. 10, the conversion efficiency was more than 14.45% when the hydrogen concentration in the passivation film was $1.4 \times 10^{22}$ atoms/$cm^3$ or more. However, at the hydrogen concentration of $8.0 \times 10^{21}$ atoms/$cm^3$, the conversion efficiency showed an obvious decrease to 14.09%. In other words, the electric property was enhanced when the hydrogen content in the film was $1.4 \times 10^{22}$ atoms/$cm^3$ or more.

The invention claimed is:

1. A method of manufacturing a solar cell comprising:
    forming microscopic protrusions and recesses on a surface of a semiconductor substrate of one conductivity-type;
    forming a diffusion layer by diffusing an impurity of an opposite conductivity-type on the surface of the semiconductor substrate of the one conductivity-type, so that a sheet resistance of the surface of the semiconductor substrate becomes in a range of 60-300 ohms/square;
    forming an antireflective film on the surface of the semiconductor substrate that is formed with the diffusion layer;
    applying electrode material on the antireflective film, the electrode material comprising a mixture of silver, glass frit and a zinc component not part of the glass frit in the form of a paste, wherein the zinc component contacts the antireflective film, wherein the zinc component is in any form selected from a group consisting of metal powder, oxide powder, organometallic compound and inorganic compound; and
    firing the electrode material to come in ohmic contact with the diffusion layer.

2. The method of manufacturing a solar cell according to claim 1, wherein the zinc is contained in an amount of 0.05 to 5 weight parts as metal per 100 weight parts of the silver in the electrode material.

3. The method of manufacturing a solar cell according to claim 1, wherein the microscopic protrusions and recesses have widths and heights of 2 µm or less, respectively.

4. The method of manufacturing a solar cell according to claim 1, wherein the aspect ratio of the microscopic protrusions and recesses is in a range of 0.1 to 2.

5. The method of manufacturing a solar cell according to claim 1, wherein the average particle size of the metal powder is in a range of 0.1 to 5 µm.

6. The method of manufacturing a solar cell according to claim 1, wherein the average particle size of the oxide powder is in a range of 0.1 to 5 µm.

7. The method of manufacturing a solar cell according to claim 1, wherein the antireflective film is a silicon nitride film, a silicon dioxide film or titanium dioxide film.

* * * * *